US011915757B2

(12) United States Patent
Sakui et al.

(10) Patent No.: US 11,915,757 B2
(45) Date of Patent: Feb. 27, 2024

(54) MEMORY DEVICE THROUGH USE OF SEMICONDUCTOR DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 168 days.

(21) Appl. No.: 17/741,975

(22) Filed: May 11, 2022

(65) Prior Publication Data

US 2022/0366986 A1    Nov. 17, 2022

(30) Foreign Application Priority Data

May 13, 2021    (WO) .................. PCT/JP2021/018251

(51) Int. Cl.
G11C 16/04 (2006.01)
G11C 16/12 (2006.01)
G11C 16/16 (2006.01)

(52) U.S. Cl.
CPC .......... G11C 16/0483 (2013.01); G11C 16/12 (2013.01); G11C 16/16 (2013.01)

(58) Field of Classification Search
CPC ...... G11C 16/0483; G11C 16/12; G11C 16/16
See application file for complete search history.

(56) References Cited

U.S. PATENT DOCUMENTS 11,011,208 B2 *  5/2021  Lim .................... G11C 7/18
11,763,877 B2 *  9/2023  Sakui ................. G11C 16/08
                                                365/185.29

(Continued)

FOREIGN PATENT DOCUMENTS

JP    H 02-188966 A    7/1990
JP    H 03-171768 A    7/1991

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Pho M Luu
(74) *Attorney, Agent, or Firm* — Crowell & Moring LLP

(57) ABSTRACT

A memory device includes pages, each being composed of a plurality of memory cells arrayed on a substrate in row form, and controls voltages to be applied to a first gate conductor layer, a second gate conductor layer, a first impurity layer, and a second impurity layer of each of the memory cells included in the pages to perform a page write operation of holding a hole group generated by an impact ionization phenomenon or a gate induced drain leakage current in a channel semiconductor layer, and controls voltages to be applied to the first gate conductor layer, the second gate conductor layer, the third gate conductor layer, the fourth gate conductor layer, the first impurity layer, and the second impurity layer to perform a page erase operation of removing the hole group out of the channel semiconductor layer.

6 Claims, 19 Drawing Sheets

(56) References Cited

U.S. PATENT DOCUMENTS

| | | | |
|---|---|---|---|
| 2003/0111681 | A1 | 6/2003 | Kawanaka |
| 2006/0049444 | A1 | 3/2006 | Shino |
| 2008/0137394 | A1 | 6/2008 | Shimano |
| 2008/0212366 | A1 | 9/2008 | Ohsawa |
| 2017/0330624 | A1* | 11/2017 | Lim ...................... H10B 43/30 |
| 2023/0386559 | A1* | 11/2023 | Sakui .................... G11C 11/409 |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron,"IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration,"Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI,"IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond,"IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory,"IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs,"IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET,"2017 IEEE Symposium on VLSI Technology Digest of Technical Papers, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI F inFETs,"Semicond. Sci. Technol. 29 (2014) 115021 (7 pp).

E. Yoshida, and T. Tanaka: "A Capacitorless 1T-DRAM Technology Using Gate-Induced Drain-Leakage (GIDL) Current for Low-Power and High-Speed Embedded Memory,"IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI,"IEICE Trans. Electron., vol. E90-c., No. 4 pp. 765-771 (2007).

International Search Report (PCT/ISA/210) (Japanese) from PCT/JP2021/018251 dated Jun. 29, 2021, 3 pgs. See a translation identified as A26.

English translation of International Search of Search Report (PCT/ISA/210) of PCT/JP2021/018251, 2 pgs. (Jan. 2015).

Written Opinion (PCT/ISA/237) (Japanese) of PCT/JP2021/018251 dated Jun. 22, 2021, 3 pgs.

F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI,"IEICE Trans. Electron., vol. E90-c., No. 4 pp. 765-771 (2007) a brief description attached.

* cited by examiner

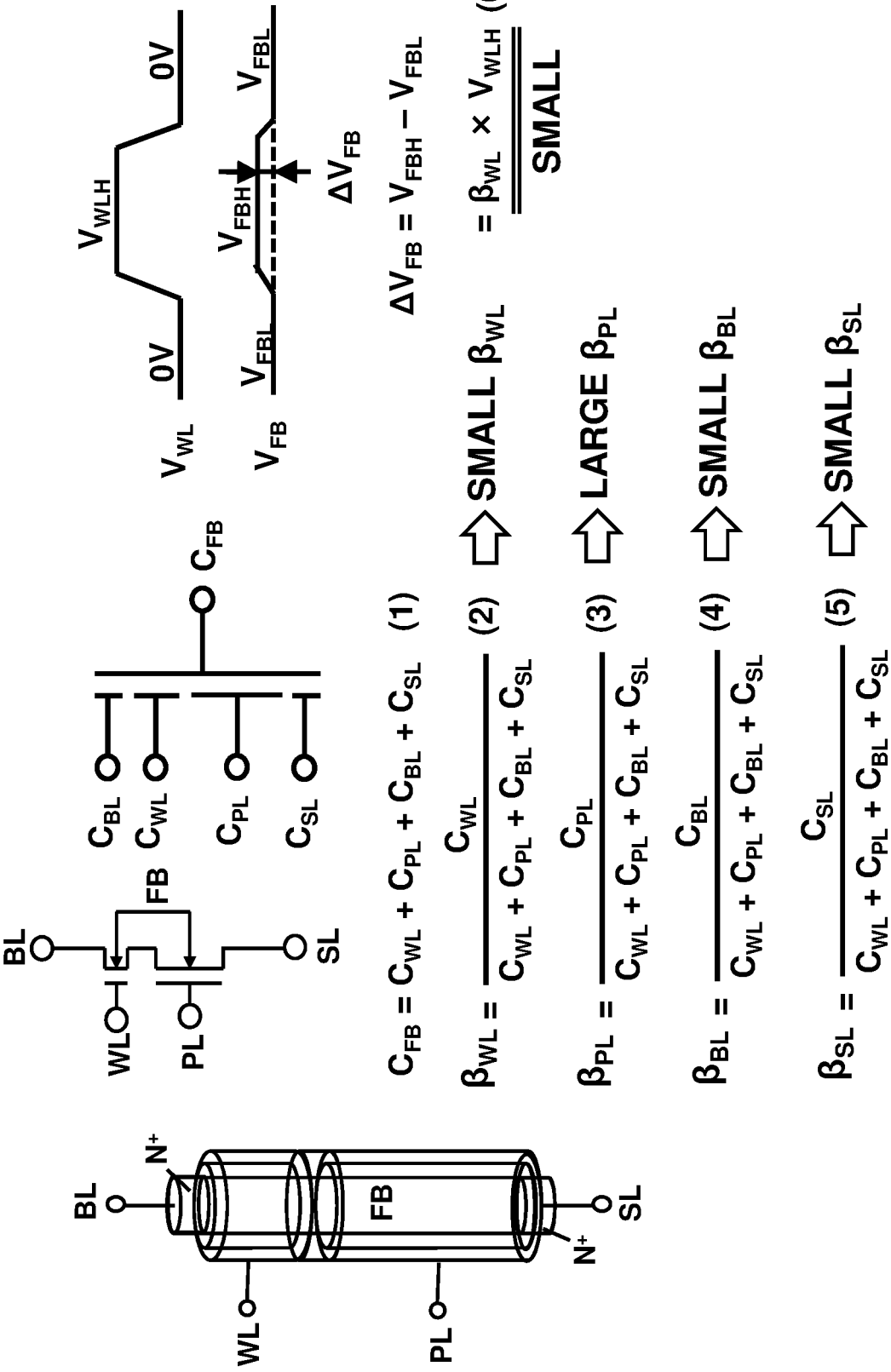

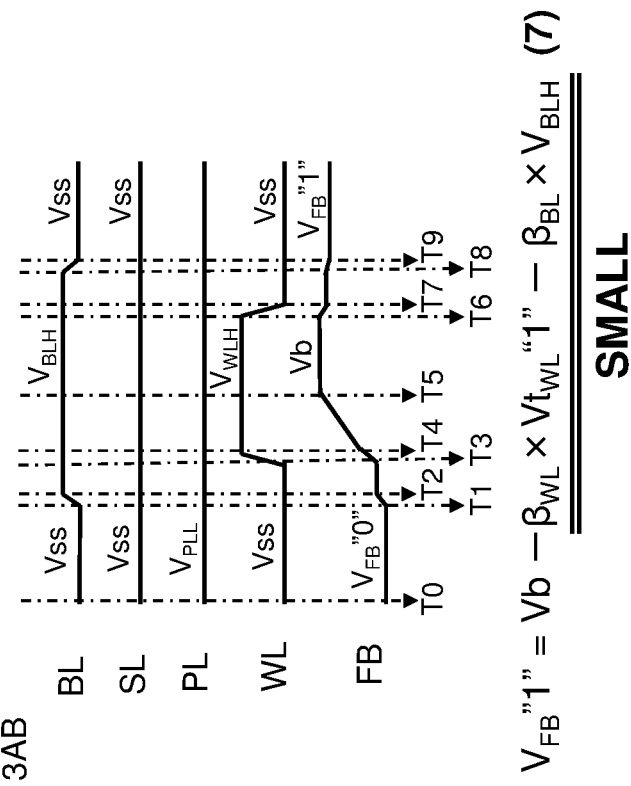
FIG. 3AB
$$V_{FB}\text{"1"} = Vb - \beta_{WL} \times Vt_{WL}\text{"1"} - \beta_{BL} \times V_{BLH} \quad (7)$$
SMALL
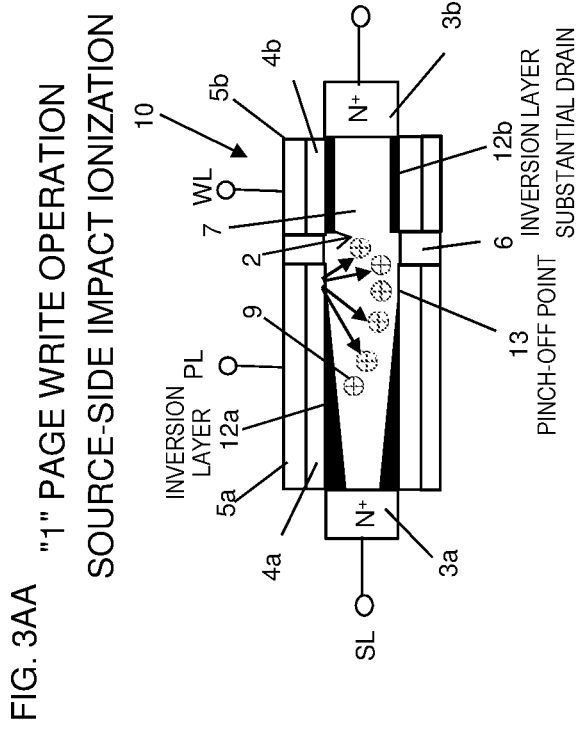
FIG. 3AA "1" PAGE WRITE OPERATION
SOURCE-SIDE IMPACT IONIZATION
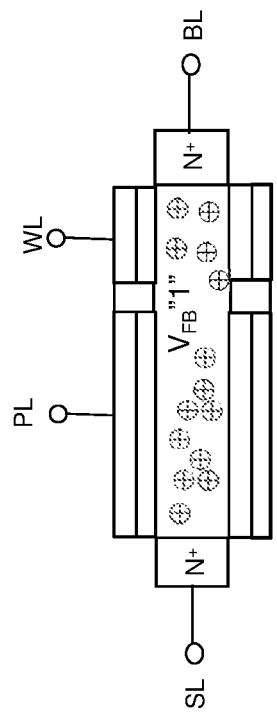
FIG. 3AC "1" WRITE STATE

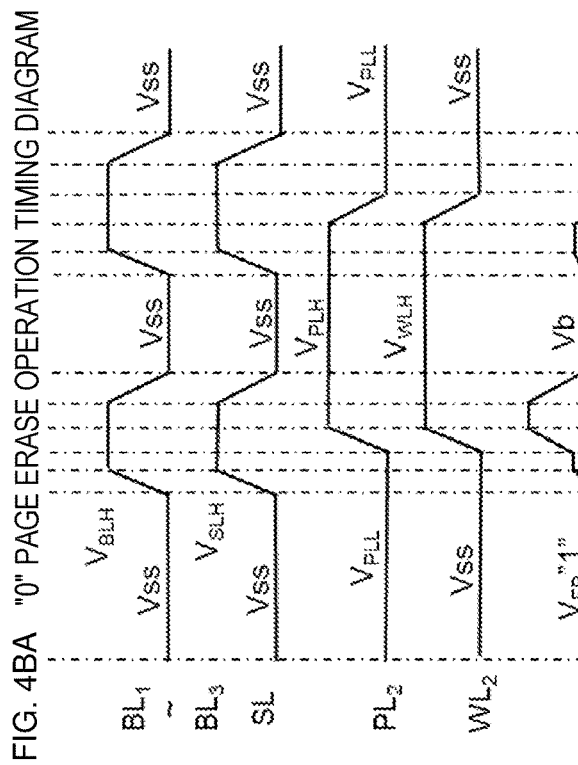

FIG. 4BA  "0" PAGE ERASE OPERATION TIMING DIAGRAM

T3 TO T4: FIRST PERIOD
T5 TO T6: SECOND PERIOD
T9 TO T10: THIRD PERIOD

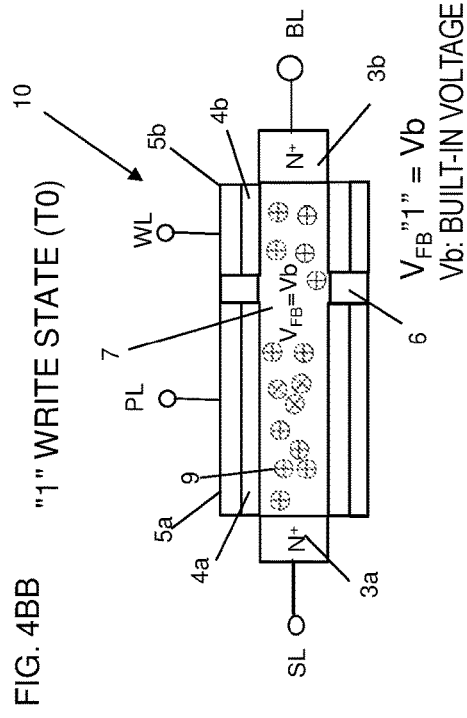

FIG. 4BB   "1" WRITE STATE (T0)

$V_{FB}\text{"1"} = Vb$  
Vb: BUILT-IN VOLTAGE  (7)

$V_{FB}\text{"0"} = Vb - \beta_{WL} \times V_{WLH} - \beta_{PL} \times (V_{PLH} - V_{PLL}) - \beta_{BL} \times V_{BLH}$  (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL}) - \beta_{WL} \times Vt_{WL}\text{"1"} - \beta_{BL} \times V_{BLH}$  (9)

WORD LINE WL AND PLATE LINE PL ARE CAPACITIVELY COUPLED TO CHANNEL REGION 7 IN "0" ERASE OPERATION (T9 TO T10)

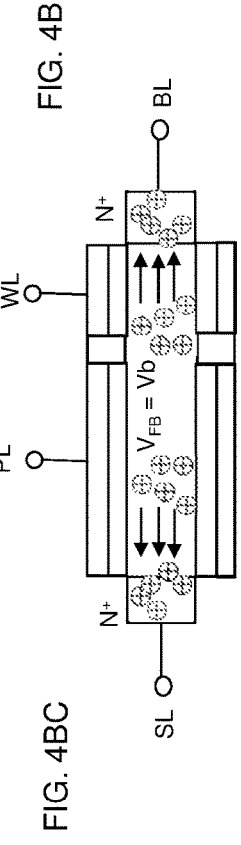

DISCHARGE HOLE GROUP 9 IN "0" ERASE OPERATION (T5 TO T6)

FIG. 4BC

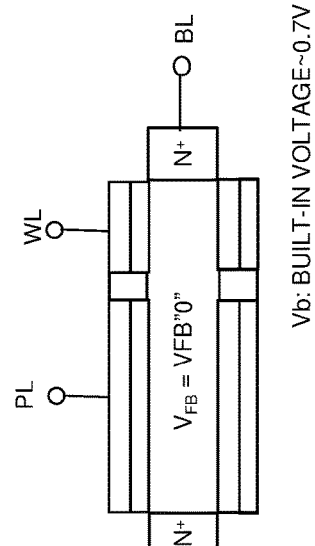

Vb: BUILT-IN VOLTAGE~0.7V

FIG. 4BD

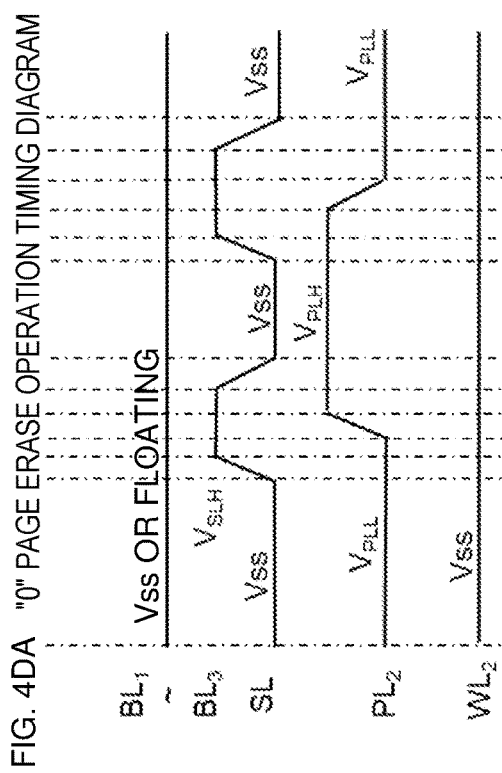

FIG. 4DA  "0" PAGE ERASE OPERATION TIMING DIAGRAM

T3 TO T4: FIRST PERIOD
T5 TO T6: SECOND PERIOD
T9 TO T10: THIRD PERIOD
DISCHARGE HOLE GROUP 9 IN "0" ERASE
OPERATION (T5 TO T6)

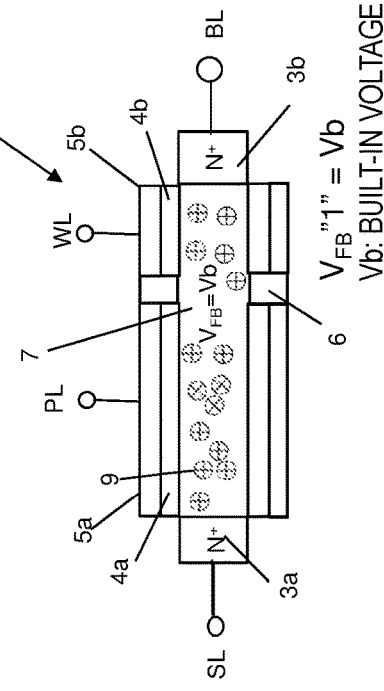

FIG. 4DB  "1" WRITE STATE (T0)

$V_{FB}\text{"1"} = Vb$
$Vb$: BUILT-IN VOLTAGE

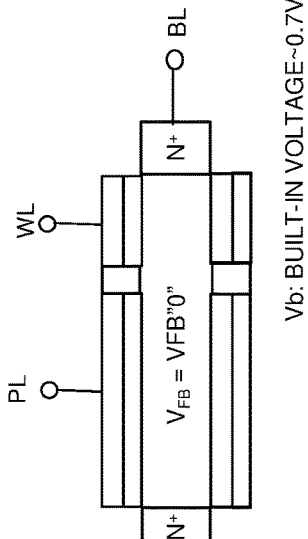

$V_{FB}\text{"1"} = Vb - \beta_{WL} \times Vt_{WL}\text{"1"} - \beta_{BL} \times V_{BLH}$  (7)

$V_{FB}\text{"0"} = Vb - \beta_{WL} \times V_{WLH} - \beta_{PL} \times (V_{PLH} - V_{PLL})$  (8)

$\Delta V_{FB} = V_{FB}\text{"1"} - V_{FB}\text{"0"}$
$= \beta_{WL} \times V_{WLH} + \beta_{PL} \times (V_{PLH} - V_{PLL})$
$- \beta_{WL} \times Vt_{WL}\text{"1"} - \beta_{BL} \times V_{BLH}$  (9)

WORD LINE WL AND PLATE LINE PL ARE CAPACITIVELY
COUPLED TO CHANNEL REGION 7 IN "0" ERASE OPERATION
(T9 TO T10)

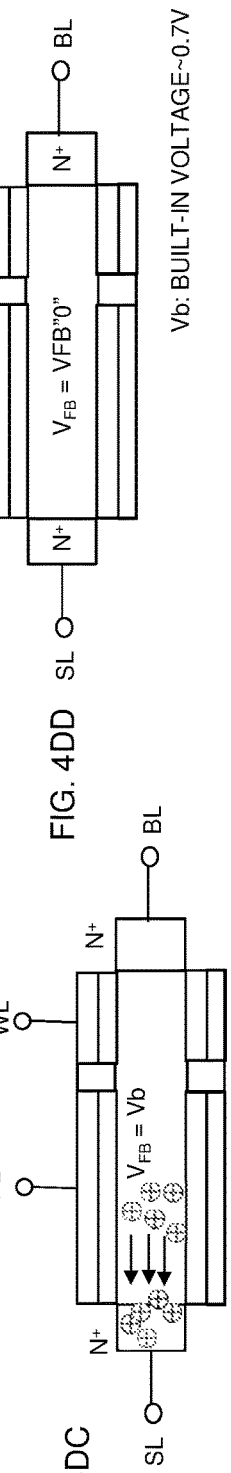

FIG. 4DC

FIG. 4DD $V_{FB} = V_{FB}\text{"0"}$ $Vb$: BUILT-IN VOLTAGE~0.7V

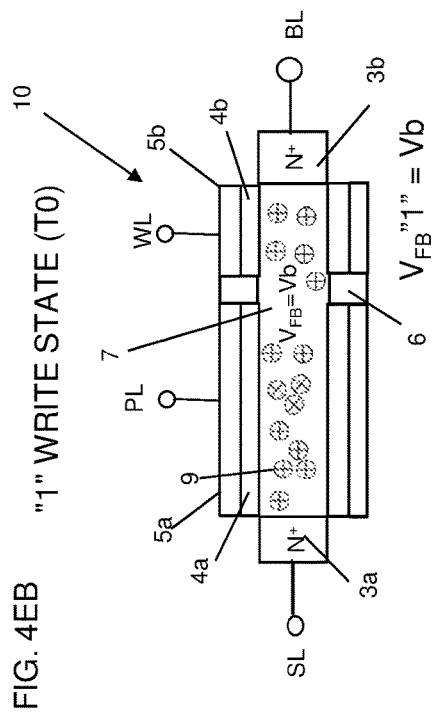

FIG. 4EA  "0" PAGE ERASE OPERATION TIMING DIAGRAM

T3 TO T4: FIRST PERIOD
T5 TO T6: SECOND PERIOD
T9 TO T10: THIRD PERIOD

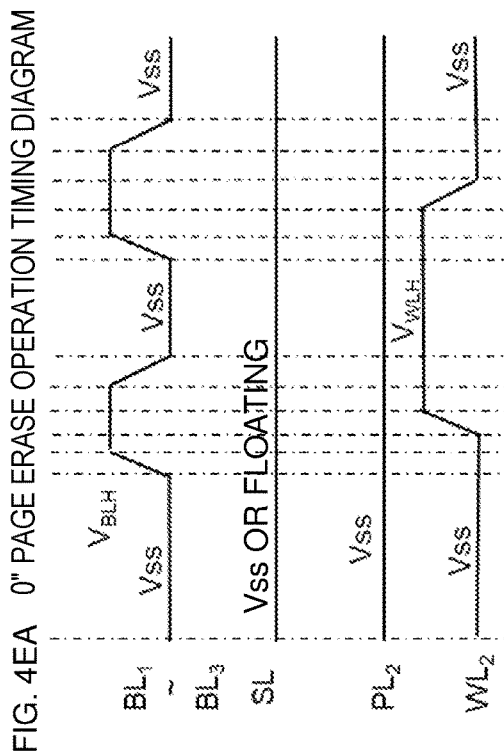

FIG. 4EB  "1" WRITE STATE (T0)

$V_{FB}"1" = Vb$
Vb: BUILT-IN VOLTAGE $V_{FB}"1" = Vb - \beta_{WL} \times Vt_{WL}"1" - \beta_{BL} \times V_{BLH}$ (7)

$V_{FB}"0" = Vb - \beta_{WL} \times V_{WLH} - \beta_{PL} \times (V_{PLH} - V_{PLL})$ (8)

$\Delta V_{FB} = V_{FB}"1" - V_{FB}"0"$
$= \beta_{WL} \times V_{WLH} + \beta_{PL} \times (V_{PLH} - V_{PLL})$
$- \beta_{WL} \times Vt_{WL}"1" - \beta_{BL} \times V_{BLH}$ (9)

WORD LINE WL AND PLATE LINE PL ARE CAPACITIVELY COUPLED TO CHANNEL REGION 7 IN "0" ERASE OPERATION (T9 TO T10)

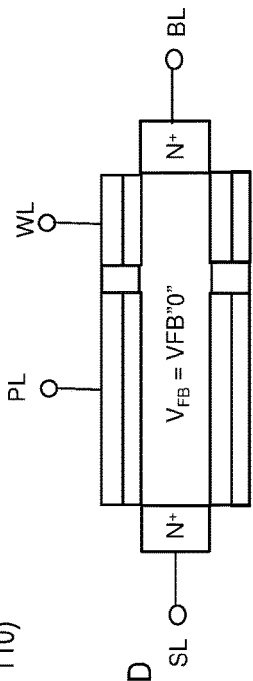

FIG. 4EC  DISCHARGE HOLE GROUP 9 IN "0" ERASE OPERATION (T5 TO T6)

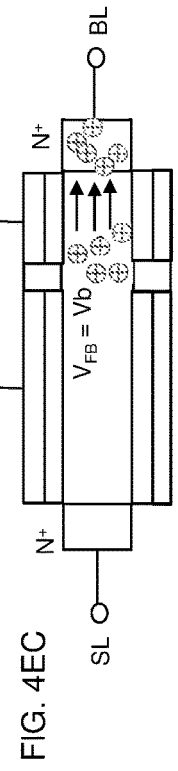

FIG. 4ED $V_{FB} = VFB"0"$

Vb: BUILT-IN VOLTAGE~0.7V

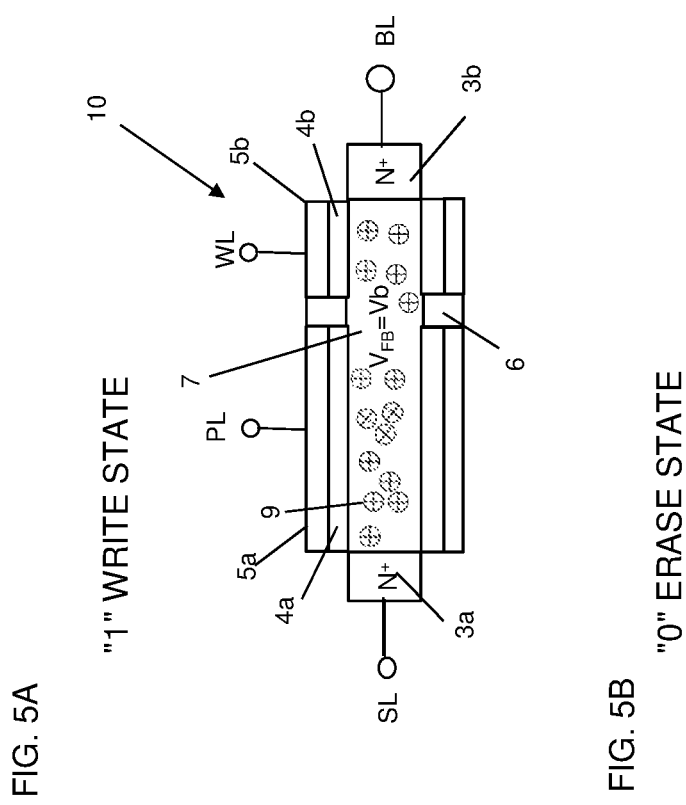
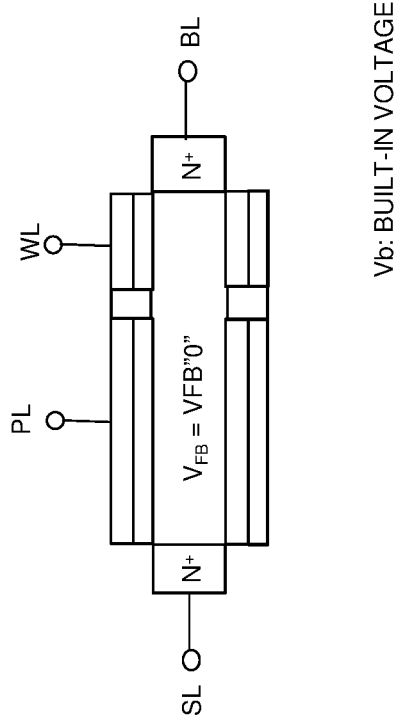
FIG. 5A "1" WRITE STATE
FIG. 5B "0" ERASE STATE
FIG. 5C

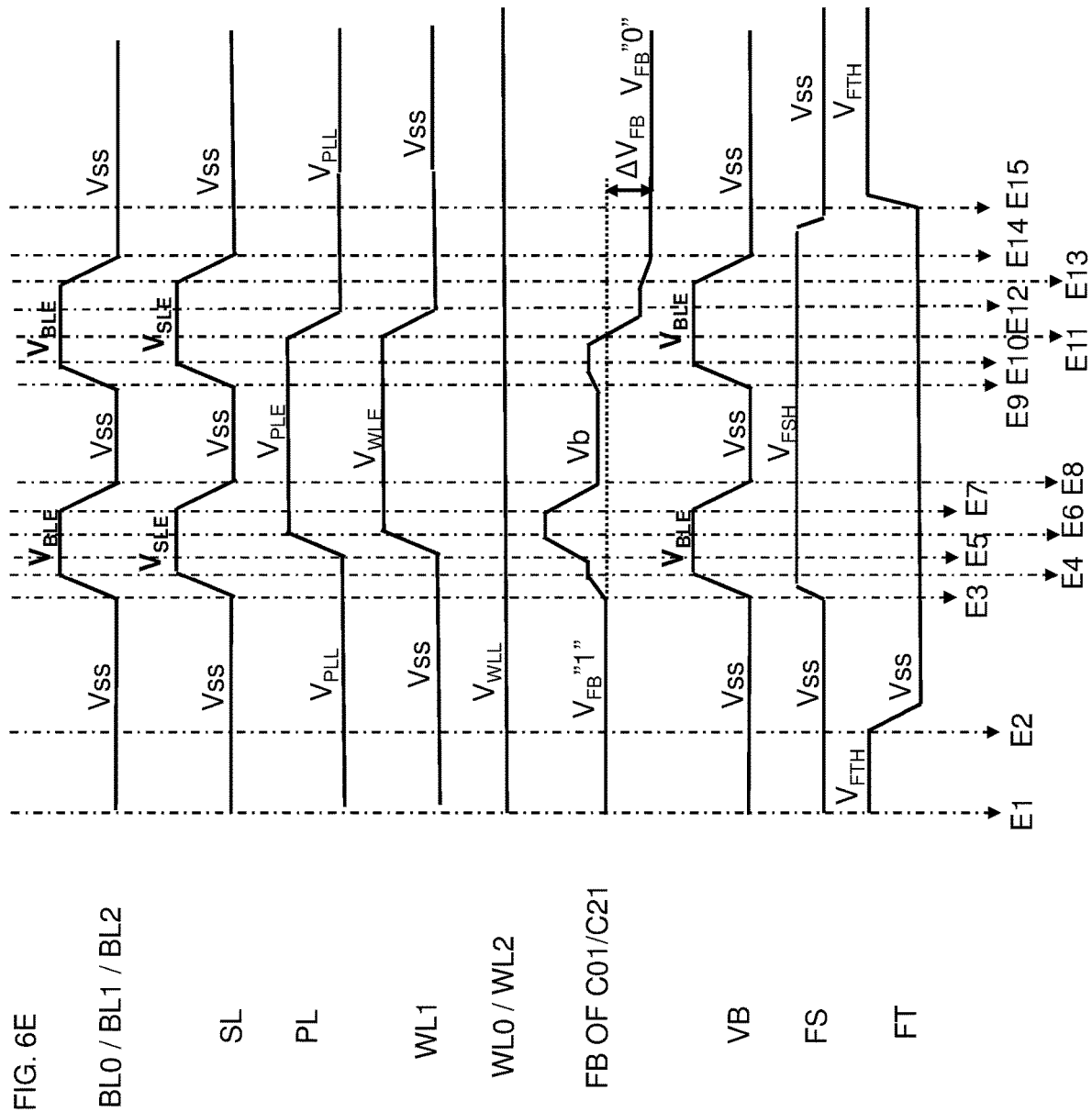

$$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

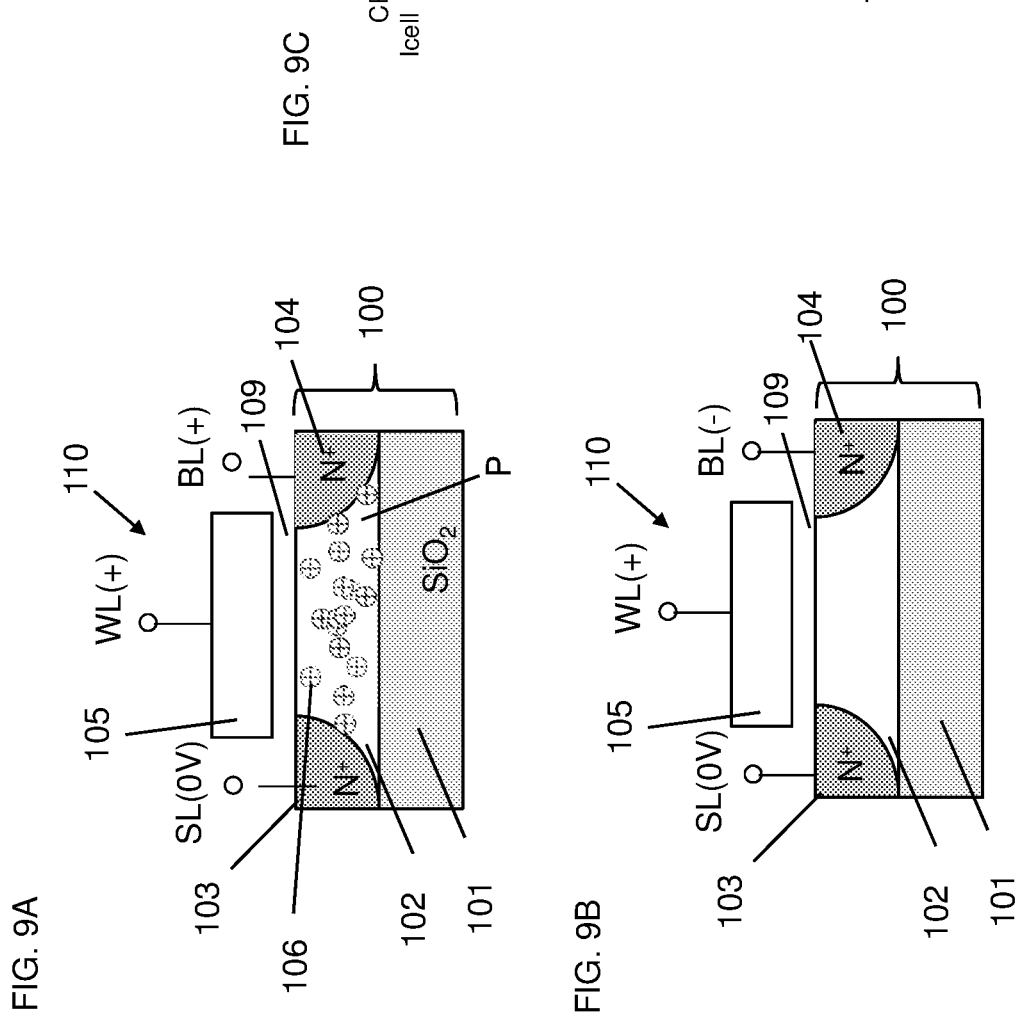

MEMORY DEVICE THROUGH USE OF SEMICONDUCTOR DEVICE

CROSS-REFERENCE TO RELATED APPLICATIONS

This application claims priority under 35 U.S.C. § 119(a) to PCT/JP2021/018251 filed May 13, 2021, the enter content of which is incorporated herein by reference.

TECHNICAL FIELD

The present invention relates to a memory device through use of a semiconductor device.

BACKGROUND ART

In recent years, in development of the large scale integration (LSI) technology, memory devices have been required to have higher integration and higher performance.

In typical planar MOS transistors, the channel extends in a horizontal direction along an upper surface of a semiconductor substrate. On the other hand, the channel of an SGT extends in a direction vertical to the upper surface of a semiconductor substrate (see Patent Literature 1 and Non Patent Literature 1, for example). Thus, the SGT enables a semiconductor device to have higher density than a planar MOS transistor does. The use of this SGT as a selection transistor can achieve higher integration of memories such as a dynamic random access memory (DRAM; see Non Patent Literature 2, for example) to which a capacitor is connected, a phase change memory (PCM; see Non Patent Literature 3, for example) to which a resistance change element is connected, a resistive random access memory (RRAM; see Non Patent Literature 4, for example), and a magneto-resistive random access memory (MRAM; see Non Patent Literature 5, for example) in which the orientation of magnetic spin is changed by a current to change resistance. In addition, there are a capacitor-less DRAM memory cell composed of a single MOS transistor (see Non Patent Literature 7), and the like. The present application relates to a dynamic flash memory which does not have a resistance change element or capacitor and which can be composed only of a MOS transistor.

FIGS. 7A to 7D show a write operation of the aforementioned capacitor-less DRAM memory cell composed of a single MOS transistor, FIGS. 8A and 8B show operational problems, and FIGS. 9A to 9C show a read operation (see Non Patent Literatures 7 to 10). FIG. 7A shows a "1" write state. Herein, the memory cell is formed in a SOI substrate 100. The DRAM memory cell composed of a source N$^+$ layer 103 (hereinafter a semiconductor region containing a high concentration of donor impurities will be referred to as an "N$^+$ layer") to which a source line SL is connected, a drain N$^+$ layer 104 to which a bit line BL is connected, a gate conductor layer 105 to which a word line WL is connected, and a floating body 102 of the MOS transistor 110, not having a capacitor, and having the single MOS transistor 110 is configured. Note that a SiO$_2$ layer 101 in the SOI substrate is located immediately under and in contact with the floating body 102. When writing "1" into the memory cell composed of this single MOS transistor 110, the MOS transistor 110 is operated in a saturation region. In other words, an electron channel 107 extending from the source N$^+$ layer 103 has a pinch-off point 108, and does not reach the drain N$^+$ layer 104 to which the bit line is connected. When the MOS transistor 110 is operated with both the bit line BL thus connected to the drain N$^+$ layer and the word line WL connected to the gate conductor layer 105 being increased in voltage, and a gate voltage being set at about half of a drain voltage, the field intensity is maximized at the pinch-off point 108 in the vicinity of the drain N$^+$ layer 104. As a result, accelerated electrons flowing from the source N$^+$ layer 103 to the drain N$^+$ layer 104 collide with a Si lattice, and electron-hole pairs are generated by kinetic energy lost at that time (an impact ionization phenomenon). A large part of generated electrons (not shown) reaches the drain N$^+$ layer 104. In addition, only a few, very hot electrons jump across the gate oxide film 109 to reach the gate conductor layer 105. Then, holes 106 generated at the same time charge the floating body 102. In this case, the generated holes contribute as an increment in majority carriers because the floating body 102 is P—Si. The floating body 102 is filled with the generated holes 106, and when the voltage of the floating body 102 becomes more than or equal to Vb exceeding the voltage of the source N$^+$ layer 103, further generated holes are discharged to the source N$^+$ layer 103. Herein, Vb is a built-in voltage of a PN junction between the source N$^+$ layer 103 and the floating body 102 which is the P layer, and is about 0.7 V. FIG. 7B shows a way in which the floating body 102 is charged to saturation with the generated holes 106.

Next, a "0" write operation in the memory cell 110 will be described with reference to FIG. 7C. The "1" write memory cell 110 and the "0" write memory cell 110 are present at random for a common selected word line WL. FIG. 7C shows a way in which the "1" write state is rewritten to the "0" write state. When writing "0", the voltage of the bit line BL is negatively biased, and the PN junction between the drain N$^+$ layer 104 and the floating body 102 which is the P layer is forward-biased. As a result, the holes 106 generated in the floating body 102 in advance in a previous cycle flow to the drain N$^+$ layer 104 connected to the bit line BL. When the write operation is terminated, two memory cell states of the memory cell 110 filled with the generated holes 106 (FIG. 7B) and the memory cell 110 from which generated holes have been discharged (FIG. 7C) are obtained. The potential of the floating body 102 in the memory cell 110 filled with the holes 106 becomes higher than the potential of the floating body 102 free from generated holes. Consequently, the threshold voltage of the "1" write memory cell 110 becomes lower than the threshold voltage of the "0" write memory cell 110. The way is shown in FIG. 7D.

Next, operational problems of the memory cell composed of this single MOS transistor 110 will be described with reference to FIGS. 8A and 8B. As shown in FIG. 8A, a capacitance $C_{FB}$ of the floating body is the sum of a capacitance $C_{WL}$ between the gate to which the word line is connected and the floating body, a junction capacitance $C_{SL}$ of the PN junction between the source N$^+$ layer 103 to which the source line is connected and the floating body 102, and a junction capacitance $C_{BL}$ of the PN junction between the drain N$^+$ layer 104 to which the bit line is connected and the floating body 102, which is expressed as:

$$C_{FB}=C_{WL}+C_{BL}+C_{SL} \tag{10}$$

In addition, a capacitive coupling ratio $\beta_{WL}$ between the gate to which the word line is connected and the floating body is expressed as:

$$\beta_{WL}=C_{WL}/(C_{WL}+C_{BL}+C_{SL}) \tag{11}$$

Consequently, when a word line voltage $V_{WL}$ oscillates during reading or during writing, the voltage of the floating body 102 to serve as a storage node (contact point) of the memory cell is affected accordingly. The way is shown in FIG. 8B. When the word line voltage $V_{WL}$ rises from 0 V to $V_{WLH}$ during reading or during writing, the voltage $V_{FB}$ of the floating body 102 rises from a voltage $V_{FB1}$ in an initial state before the word line voltage changes to $V_{FB2}$ because of the capacitive coupling with the word line. A voltage change amount $\Delta V_{FB}$ thereof is expressed as:

$$\Delta V_{FB} = V_{FB2} - V_{FB1}$$

$$= \beta_{WL} \times V_{WLH} \qquad (12)$$

Herein, a contribution ratio of $C_{WL}$ is large in $\beta_{WL}$ in Expression (11), and $C_{WL}:C_{BL}:C_{SL}=8:1:1$ holds, for example. In this case, $\beta_{WL}=0.8$ holds. When the word line drops from 5 V during writing to 0 V after writing is terminated, for example, the floating body 102 is subject to an amplitude noise as large as 5 V×$\beta_{WL}$=4 V because of the capacitive coupling between the word line WL and the floating body 102. This raises a problem in that a potential difference margin between the "1" potential and the "0" potential of the floating body 102 during writing cannot be sufficiently attained.

FIGS. 9A to 9C show a read operation. FIG. 9(a) shows the "1" write state, and FIG. 9B shows the "0" write state. Actually, however, even if Vb is written into the floating body 102 by writing "1", the floating body 102 is reduced to a negative bias when the word line returns to 0 V by termination of writing. When "0" is written, the floating body 102 is negatively biased more deeply, so that as shown in FIG. 9C, the "1" and "0" potential difference margin cannot be made sufficiently wide during writing. Thus, it has actually been difficult to bring a capacitor-less DRAM memory cell to production.

CITATION LIST

Patent Literature

[Patent Literature 1]
Japanese Patent Laid-Open No. 2-188966
[Patent Literature 2]
Japanese Patent Laid-Open No. 3-171768
[Patent Literature 3]
Japanese Patent No. 3957774

Non Patent Literature

[Non Patent Literature 1]
Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[Non Patent Literature 2]
H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)
[Non Patent Literature 3]
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)
[Non Patent Literature 4]
T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3 V," IEDM (2007)
[Non Patent Literature 5]
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)
[Non Patent Literature 6]
M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)
[Non Patent Literature 7]
J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012)
[Non Patent Literature 8]
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002).
[Non Patent Literature 9]
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006).
[Non Patent Literature 10]
E. Yoshida, T. Tanaka: "A Design of a Capacitorless 1T-DRAM Cell Using Gate-induced Drain Leakage (GIDL) Current for Low-power and High-speed Embedded Memory," IEEE IEDM (2003).
[Non Patent Literature 11]
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp. 186-191, May 2006.
[Non Patent Literature 12]
N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017.
[Non Patent Literature 13]
H. Jiang, N. Xu, B. Chen, L. Zengl, Y. He, G. Du, X. Liu and X. Zhang: "Experimental investigation of self-heating effect (SHE) in multiple-fin SOI FinFETs," Semicond. Sci. Technol. 29 (2014) 115021 (7 pp).
[Non Patent Literature 14]
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-69, April 2006.

SUMMARY OF INVENTION

Technical Problem

In a capacitor-less, 1-transistor DRAM (gain cell), the capacitive coupling between the word line and the floating body is large, and when the potential of the word line is oscillated when reading data or when writing data, the oscillation is disadvantageously transmitted as noise directly to the floating body. As a result, problems of erroneous reading and erroneous rewriting of stored data are raised, and it has been difficult to put a capacitor-less, 1-transistor DRAM (gain cell) into practical use.

Solution to Problem

In order to solve the above-described problems, a memory device according to the present invention is a memory device, including a plurality of pages arrayed in a column direction, each of the pages being composed of a plurality of memory cells arrayed on a substrate in a row direction, in which
  each of the memory cells included in each of the pages has,
  a semiconductor base standing in a vertical direction or extending in a horizontal direction on the substrate with respect to the substrate,
  a first impurity layer and a second impurity layer located on opposite ends of the semiconductor base,
  a first gate insulating layer that surrounds part or whole of a side surface of the semiconductor base between the first impurity layer and the second impurity layer, and is in contact with or proximate to the first impurity layer,
  a second gate insulating layer that surrounds the side surface of the semiconductor base, connects to the first gate insulating layer, and is in contact with or proximate to the second impurity layer,
  a first gate conductor layer that covers part or whole of the first gate insulating layer,
  a second gate conductor layer that covers the second gate insulating layer, and
  a channel semiconductor layer in which the semiconductor base is covered by the first gate insulating layer and the second gate insulating layer,
  the memory device controls voltages to be applied to the first gate conductor layer, the second gate conductor layer, the first impurity layer, and the second impurity layer to perform a page write operation and a page erase operation,
  the first impurity layer of the each of the memory cells is connected to a source line, the second impurity layer is connected to a bit line, one of the first gate conductor layer and the second gate conductor layer is connected to one of word lines, and the other is connected to a first driving control line, and
  the first driving control line is provided in common for adjacent ones of the pages, and when in the page erase operation, the memory device applies pulsed voltages to one of the word lines which performs the page erase operation and the first driving control line, and applies a fixed voltage to another one of the word lines which is not selected to perform the page erase operation (a first invention).

In the above-described first invention, the fixed voltage is a ground voltage (a second invention).

In the above-described first invention, the one of the word lines which performs the page erase operation includes at least one or more selected word lines (a third invention).

In the above-described first invention, a first gate capacitance between the first gate conductor layer and the channel semiconductor layer is larger than a second gate capacitance between the second gate conductor layer and the channel semiconductor layer (a fourth invention).

In the above-described first invention, when seen in a central axis direction, the first gate conductor layer surrounds the first gate insulating layer, and is separated into at least two conductor layers (a fifth invention).

In the above-described first invention, when in the page write operation, the memory device holds a hole group generated by an impact ionization phenomenon in the channel semiconductor layer to change a voltage of the channel semiconductor layer to a first data holding voltage which is higher than a voltage of one of or voltages of both of the first impurity layer and the second impurity layer, and
  when in the page erase operation, the memory device controls voltages to be applied to the first impurity layer, the second impurity layer, the first gate conductor layer, and the second gate conductor layer to extract the hole group from one or both of the first impurity layer and the second impurity layer, and change the voltage of the channel semiconductor layer to a second data holding voltage which is lower than the first data holding voltage (a sixth invention).

BRIEF DESCRIPTION OF DRAWINGS

FIGS. 2A, 2B and 2C show diagrams describing an effect in a case in which a gate capacitance of a first gate conductor layer 5a connected to a plate line PL of the memory device having the SGT according to the first embodiment is made larger than a gate capacitance of a second gate conductor layer 5b to which a word line WL is connected.

FIGS. 3AA, 3AB and 3AC shows diagrams for describing a write operation mechanism of the memory device having the SGT according to the first embodiment.

FIGS. 4BA, 4BB, 4BC and 4BD show diagrams for describing the page erase operation mechanism of the memory device having the SGT according to the first embodiment.

FIGS. 4DA, 4DB, 4DC and 4DD show diagrams for describing the page erase operation mechanism of the memory device having the SGT according to the first embodiment.

FIGS. 4EA, 4EB, 4EC and 4ED show diagrams for describing the page erase operation mechanism of the memory device having the SGT according to the first embodiment.

FIGS. 5A, 5B and 5C show diagrams for describing a read operation mechanism of the memory device having the SGT according to the first embodiment.

FIG. 6E is a diagram for describing providing the plate line PL of the memory device having the SGT according to the first embodiment in common for adjacent pages, and when in the page erase operation, applying pulsed voltages to the word line WL which performs the page erase operation and the plate line PL, and applying a fixed voltage to the word line which is not selected to perform the page erase operation.

FIGS. 9A, 9B and 9C show diagrams showing a read operation of the capacitor-less DRAM memory cell according to the conventional example.

MODE FOR CARRYING OUT THE INVENTION

Hereinafter, embodiments of a memory device (hereinbelow referred to as a dynamic flash memory) through use of semiconductor device according to the present invention will be described with reference to the drawings.

First Embodiment

A structure and an operation mechanism of a dynamic flash memory cell according to a first embodiment of the present invention will be described with reference to FIGS. 1 to 5A-5C. The structure of the dynamic flash memory cell will be described with reference to FIG. 1. Then, an effect in a case in which a gate capacitance of a first gate conductor layer 5a connected to a plate line PL is made larger than a gate capacitance of a second gate conductor layer 5b to which a word line WL is connected will be described with reference to FIGS. 2A to 2C. Then, a data write operation mechanism will be described with reference to FIGS. 3AA to 3AC and 3B, a data erase operation mechanism will be described with reference to FIGS. 4A to 4EA-4ED, and a data read operation mechanism will be described with reference to FIGS. 5A to 5C.

Figure 1:
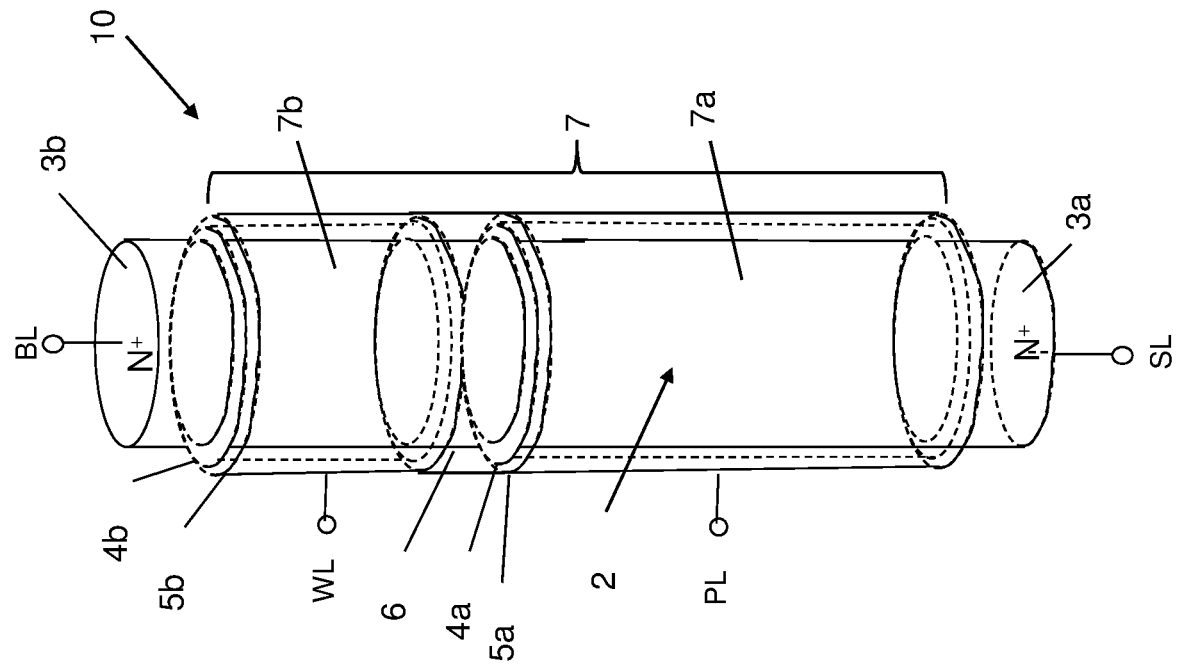
FIG. 1 is a structural diagram of a memory device having an SGT according to a first embodiment.

FIG. 1 shows the structure of the dynamic flash memory cell according to the first embodiment of the present invention. $N^+$ layers 3a and 3b (which are examples of a "first impurity layer" and a "second impurity layer" as claimed), which when one serves as a source, the other serves as a drain, are formed at upper and lower positions in a silicon semiconductor pillar 2 (hereinafter the silicon semiconductor pillar will be referred to as a "Si pillar") (which is an example of a "semiconductor base" as claimed) formed on a substrate and having a P-type or an i-type (intrinsic) conductivity type. A portion of the Si pillar 2 between these $N^+$ layers 3a and 3b to serve as the source and the drain serves as a channel region 7 (which is an example of a "channel semiconductor layer" as claimed). A first gate insulating layer 4a (which is an example of a "first gate insulating layer" as claimed) and a second gate insulating layer 4b (which is an example of a "second gate insulating layer" as claimed) are formed in a manner surrounding this channel region 7. The first gate insulating layer 4a and the second gate insulating layer 4b are respectively in contact with or proximate to the $N^+$ layers 3a and 3b to serve as the source and the drain. A first gate conductor layer 5a (which is an example of a "first gate conductor layer" as claimed) and a second gate conductor layer 5b (which is an example of a "second gate conductor layer" as claimed) are respectively formed in a manner surrounding the first gate insulating layer 4a and the second gate insulating layer 4b. Then, the first gate conductor layer 5a and the second gate conductor layer 5b are separated by an insulating layer 6 (which is an example of a "first insulating layer" as claimed). Then, the channel region 7 between the $N^+$ layers 3a and 3b is composed of a first channel Si layer 7a (which is an example of a "first channel semiconductor layer" as claimed) surrounded by the first gate insulating layer 4a and a second channel Si layer 7b (which is an example of a "second channel semiconductor layer" as claimed) surrounded by the second gate insulating layer 4b. A dynamic flash memory cell 10 composed of the $N^+$ layers 3a and 3b to serve as the source and the drain, the channel region 7, the first gate insulating layer 4a, the second gate insulating layer 4b, the first gate conductor layer 5a, and the second gate conductor layer 5b is thereby formed. Then, the $N^+$ layer 3a to serve as the source is connected to a source line SL (which is an example of a "source line" as claimed), the $N^+$ layer 3b to serve as the drain is connected to a bit line BL (which is an example of a "bit line" as claimed), the first gate conductor layer 5a is connected to the plate line PL (which is an example of a "first driving control line" as claimed), and the second gate conductor layer 5b is connected to the word line WL (which is an example of a "word line" as claimed), respectively. The dynamic flash memory cell 10 desirably has such a structure that the gate capacitance of the first gate conductor layer 5a to which the plate line PL is connected is larger than the gate capacitance of the second gate conductor layer 5b to which the word line WL is connected.

Note that in FIG. 1, the gate length of the first gate conductor layer 5a is made longer than the gate length of the second gate conductor layer 5b such that the gate capacitance of the first gate conductor layer 5a connected to the plate line PL is larger than the gate capacitance of the second gate conductor layer 5b to which the word line WL is connected. However, alternatively, film thicknesses of the respective gate insulating layers may be changed to make the film thickness of a gate insulating film of the first gate insulating layer 4a thinner than the film thickness of a gate insulating film of the second gate insulating layer 4b, rather than making the gate length of the first gate conductor layer 5a longer than the gate length of the second gate conductor layer 5b. Alternatively, materials of the respective gate insulating layers may be changed in dielectric constant to make the dielectric constant of the gate insulating film of the first gate insulating layer 4a higher than the dielectric constant of the gate insulating film of the second gate insulating layer 4b. Alternatively, any of the lengths of the gate conductor layers 5a and 5b, and the film thicknesses and the dielectric constants of the gate insulating layers 4a and 4b may be combined to make the gate capacitance of the first gate conductor layer 5a connected to the plate line PL larger than the gate capacitance of the second gate conductor layer 5b to which the word line WL is connected.

FIGS. 2A to 2C are diagrams describing an effect in the case in which the gate capacitance of the first gate conductor layer 5a connected to the plate line PL is made larger than the gate capacitance of the second gate conductor layer 5b to which the word line WL is connected.

FIG. 2A shows only essential portions of the structural diagram of the dynamic flash memory cell according to the first embodiment of the present invention in a simplified manner. The bit line BL, the word line WL, the plate line PL, and the source line SL are connected to the dynamic flash memory cell, and a potential level of the channel region 7 is determined depending on their voltage levels.

FIG. 2B is a diagram for describing a relationship between respective capacitances. A capacitance $C_{FB}$ of the channel region 7 is the sum of a capacitance $C_{WL}$ between the gate conductor layer 5b to which the word line WL is connected and the channel region 7, a capacitance $C_{PL}$ between the gate conductor layer 5a to which the plate line PL is connected and the channel region 7, a junction capacitance $C_{SL}$ of a PN junction between the source N+ layer 3a to which the source line SL is connected and the channel region 7, and a junction capacitance $C_{BL}$ of a PN junction between the drain N+ layer 3b to which the bit line BL is connected and the channel region 7, and is expressed as:

$$C_{FB}=C_{WL}+C_{PL}+C_{BL}+C_{SL} \quad (1)$$

Consequently, a coupling rate $\beta_{WL}$ between the word line WL and the channel region 7, a coupling rate $\beta_{PL}$, between the plate line PL and the channel region 7, a coupling rate $\beta_{BL}$ between the bit line BL and the channel region 7, and a coupling rate $\beta_{SL}$, between the source line SL and the channel region 7 are respectively expressed as follows:

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Herein, $\beta_{PL}>\beta_{WL}$ holds because $C_{PL}>C_{WL}$ holds.

FIG. 2C is a diagram for describing a change in the voltage $V_{FB}$ of the channel region 7 when a voltage $V_{WL}$ of the word line WL rises and thereafter drops in the read operation and the write operation. Herein, a potential difference $\Delta V_{FB}$ when the voltage $V_{FB}$ of the channel region 7 rises from a low voltage level $V_{FBL}$ to a high voltage level $V_{FBH}$ when the voltage $V_{WL}$ of the word line WL rises from 0 V to a high voltage level $V_{WLH}$ is expressed as follows:

$$\Delta V_{FB}=V_{FBH}-V_{FBL}$$

$$=\beta_{WL}\times V_{WLH} \quad (6)$$

Because of the small coupling rate $\beta_{WL}$ between the word line WL and the channel region 7 and the large coupling rate $\beta_{PL}$ between the plate line PL and the channel region 7, $\Delta V_{FB}$ is small, and the voltage $V_{FB}$ of the channel region 7 hardly changes even if the voltage $V_{WL}$ of the word line WL rises and drops in the read operation and the write operation.

Figure 3B:
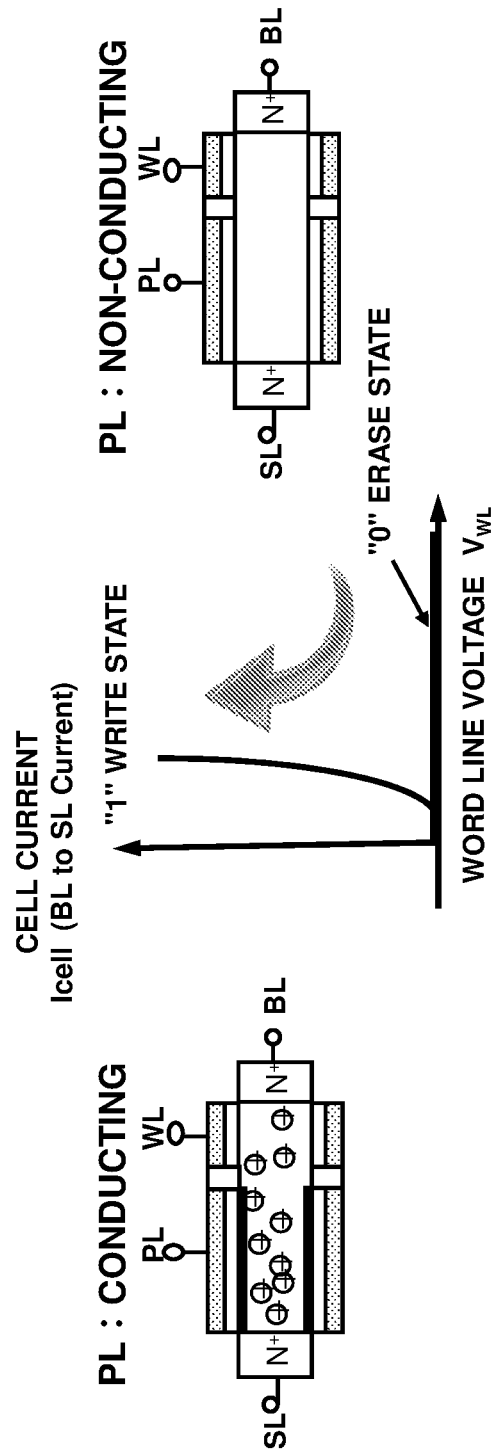
FIG. 3B shows diagrams for describing the write operation mechanism of the memory device having the SGT according to the first embodiment.

FIGS. 3AA to 3AC and FIG. 3B show a memory write operation (which is an example of a "memory write operation" as claimed) of the dynamic flash memory cell according to the first embodiment of the present invention. FIG. 3AA shows a mechanism of the write operation, and FIG. 3AB shows operation waveforms of the bit line BL, the source line SL, the plate line PL, the word line WL, and the channel region 7 which is the floating body FB. At time T0, the dynamic flash memory cell is in a "0" erase state, and the voltage of the channel region 7 is $V_{FB}$"0". In addition, Vss is applied to the bit line BL, the source line SL, and the word line WL, while $V_{PLL}$ is applied to the plate line PL. Herein, Vss is 0 V and $V_{PLL}$ is 2 V, for example. Next, when the bit line BL rises from Vss to $V_{BLH}$ at time T1-T2, the voltage of the channel region 7 becomes $V_{FB}$"0"$+\beta_{BL}\times V_{BLH}$ because of the capacitive coupling between the bit line BL and the channel region 7 in a case in which Vss is 0 V, for example.

The write operation of the dynamic flash memory cell will be described continuously with reference to FIGS. 3AA and 3AB. At time T3-T4, the word line WL rises from Vss to $V_{WLH}$. Thus, assuming that a "0" erase threshold voltage of a second N-channel MOS transistor region in which the second gate conductor layer 5b to which the word line WL is connected surrounds the channel region 7 is $Vt_{WL}$"0", the voltage of the channel region 7 becomes $V_{FB}$"0"$+\beta_{BL}\times V_{BLH}+\beta_{WL}\times Vt_{WL}$"0" in association with the increase in voltage of the word line WL from Vss to $Vt_{WL}$"0" because of the second capacitive coupling between the word line WL and the channel region 7. When the voltage of the word line WL rises to $Vt_{WL}$"0" or above, an annular inversion layer 12b is formed in the channel region 7 on the inner periphery of the second gate conductor layer 5b, and interrupts the second capacitive coupling between the word line WL and the channel region 7.

The write operation of the dynamic flash memory cell will be described continuously with reference to FIGS. 3AA and 3AB. At time T3-T4, $V_{PLL}$=2 V, for example, is fixedly input to the first gate conductor layer 5a to which the plate line PL is connected, and the second gate conductor layer 5b to which the word line WL is connected is raised to $V_{WLH}$=4 V, for example. As a result, as shown in FIG. 3AA, an annular inversion layer 12a is formed in the channel region 7 on the inner periphery of the first gate conductor layer 5a to which the plate line PL is connected, and a pinch-off point 13 is present in the inversion layer 12a. As a result, a first N-channel MOS transistor region having the first gate conductor layer 5a operates in a saturation region. On the other hand, the second N-channel MOS transistor region having the second gate conductor layer 5b to which the word line WL is connected operates in a linear region. As a result, a pinch-off point is not present in the channel region 7 on the inner periphery of the second gate conductor layer 5b to which the word line WL is connected, but the inversion layer 12b is formed all over the inner periphery of the second gate conductor layer 5b. The inversion layer 12b formed all over the inner periphery of the second gate conductor layer 5b to which the word line WL is connected serves as a substantial drain of the second N-channel MOS transistor region having the second gate conductor layer 5b. As a result, the electric field is maximized in a first boundary region of the channel region 7 between the first N-channel MOS transistor region having the first gate conductor layer 5a and the second N-channel MOS transistor region having the second gate conductor layer 5b connected in series, and the impact ionization phenomenon occurs in this region. Since this region is a source-side region as seen from the second N-channel MOS transistor region having the second gate conductor layer 5b to which the word line WL is connected, this phenomenon is called a source-side impact ionization phenomenon. This source-side impact ionization phenomenon allows electrons to flow from the N$^+$ layer 3a to which the source line SL is connected to the N$^+$ layer 3b to which the bit line is connected. Accelerated electrons collide with lattice Si atoms, and electron-hole pairs are generated by kinetic energy thereof. Part of generated electrons flows to the first gate conductor layer 5a and the second gate conductor layer 5b, but a large part thereof flows to the N$^+$ layer 3b to which the bit line BL is connected (not shown).

Then, as shown in FIG. 3AC, a hole group 9 (which is an example of a "hole group" as claimed) having been generated is a majority carrier in the channel region 7, and charges the channel region 7 to a positive bias. Since the N$^+$ layer 3a to which the source line SL is connected is at 0 V, the channel region 7 is charged to a built-in voltage Vb (about 0.7 V) of the PN junction between the N$^+$ layer 3a to which the source line SL is connected and the channel region 7. When the channel region 7 is charged to a positive bias, threshold voltages of the first N-channel MOS transistor region and the second N-channel MOS transistor region decrease because of a substrate bias effect.

The write operation of the dynamic flash memory cell will be described continuously with reference to FIG. 3AB. At time T6-T7, the voltage of the word line WL drops from $V_{WLH}$ to Vss. At that time, the word line WL and the channel region 7 form the second capacitive coupling, but the inversion layer 12b interrupts this second capacitive coupling until the voltage $V_{WLH}$ of the word line WL becomes less than or equal to a threshold voltage $Vt_{WL}$"1" of the second N-channel MOS transistor region when the voltage of the channel region 7 is Vb. Consequently, a substantial capacitive coupling between the word line WL and the channel region 7 is formed only when the word line WL becomes less than or equal to $Vt_{WL}$"1" and drops to Vss. As a result, the voltage of the channel region 7 becomes Vb−$β_{WL}$×$Vt_{WL}$"1". Herein, $Vt_{WL}$"1" is lower than $Vt_{WL}$"0" described above, and $β_{WL}$×$Vt_{WL}$"1" is small.

The write operation of the dynamic flash memory cell will be described continuously with reference to FIG. 3AB. At time T8-T9, the bit line BL drops from $V_{BLH}$ to Vss. Since the bit line BL and the channel region 7 are capacitively coupled, a "1" write voltage $V_{FB}$"1" of the channel region 7 is eventually expressed as follows:

$$V_{FB}\text{"1"}=Vb-\beta_{WL}\times Vt_{WL}\text{"1"}-\beta_{BL}\times V_{BLH} \quad (7)$$

Herein, the coupling ratio $β_{BL}$ between the bit line BL and the channel region 7 is also small. Thus, the threshold voltage of the second N-channel MOS transistor region in the second channel region 7b to which the word line WL is connected decreases as shown in FIG. 3B. The memory write operation of changing the "1" write voltage of the channel region 7 to a first data holding voltage (which is an example of a "first data holding voltage" as claimed) is performed for allocation to logic storage data "1".

Note that when in the write operation, electron-hole pairs may be generated by the impact ionization phenomenon in a second boundary region between the first impurity layer 3a and the first channel semiconductor layer 7a or a third boundary region between the second impurity layer 3b and the second channel semiconductor layer 7b instead of the first boundary region, and the channel region 7 may be charged with the generated hole group 9.

Note that conditions for voltages to be applied to the bit line BL, the source line SL, the word line WL, and the plate line PL described above as well as the potential of the floating body are an example for performing the write operation, and other operating conditions that enable the write operation may be adopted.

A mechanism of a memory erase operation (which is an example of a "memory erase operation" as claimed) will be described with reference to FIGS. 4A to 4EA-4ED.

Figure 4A:
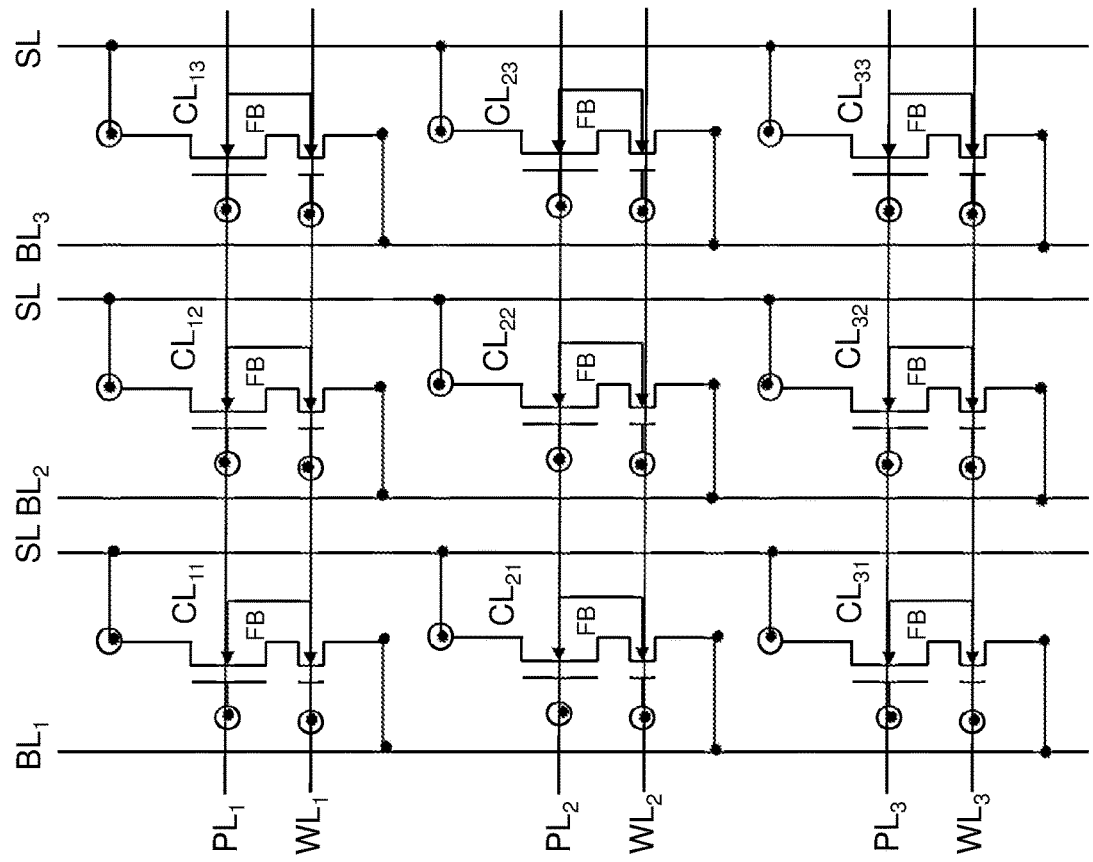
FIG. 4A is a diagram for describing a page erase operation mechanism of the memory device having the SGT according to the first embodiment.

FIG. 4A shows a memory block circuit diagram for describing the page erase operation. Herein, a total of 3×3 nine memory cells $CL_{11}$ to $CL_{33}$ are shown, but an actual memory block is larger than this matrix. When the memory cells are arrayed in matrix form, one direction of the array is referred to as a "row direction" (or "row form"), and a direction vertical to this is referred to as a "column direction" (or "column form"). The source line SL, bit lines $BL_1$ to $BL_3$, plate lines $PL_1$ to $PL_3$, and word lines $WL_1$ to $WL_3$ are connected to the respective memory cells. For example, it is assumed that memory cells $CL_{21}$ to $CL_{23}$ to which the plate line $PL_2$ and the word line $WL_2$ of any page (which is an example of a "page" as claimed) are connected are selected in this block, and the page erase operation is performed.

The mechanism of the page erase operation will be described with reference to FIGS. 4BA to 4BD and FIG. 4C. Herein, the channel region 7 between the N$^+$ layers 3a and 3b are electrically isolated from the substrate, and is a floating body. FIG. 4BA shows a timing operation waveform diagram of the principal nodes in the erase operation. In FIG. 4BA, T0 to T12 represent times from the start to end of the erase operation. FIG. 4BB shows a state in which the hole group 9 generated by impact ionization in a preceding cycle is stored in the channel region 7 at time T0 before the erase operation. Then, at time T1-T2, the bit lines $BL_1$ to $BL_3$ and the source line SL rise from Vss to high voltage levels, $V_{BLH}$ and $V_{SLH}$, respectively. Herein, Vss is 0 V, for example. In this operation, at time T3-T4 in the next period, the plate line $PL_2$ and the word line $WL_2$ selected by the page erase operation are brought into high voltage levels from a first voltage $V_{PLL}$ to a second voltage $V_{PLH}$, and from a third voltage Vss to a fourth voltage $V_{WLH}$, respectively, so that the inversion layer 12a on the inner periphery of the first gate conductor layer 5a to which the plate line $PL_2$ is connected and the inversion layer 12b on the inner periphery of the second gate conductor layer 5b to which the word line $WL_2$ is connected are not formed in the channel region 7. Consequently, assuming that threshold voltages of the second N-channel MOS transistor region on the word line $WL_2$ side and the first N-channel MOS transistor region on the plate line $PL_2$ side are $Vt_{WL}$ and $V_{tPL}$, respectively, the voltages $V_{BLH}$ and $V_{SLH}$ desirably satisfy $V_{BLH}$>$V_{WLH}$+$V_{tWL}$ and $V_{SLH}$>$V_{PLH}$+$V_{tPL}$. For example, in a case in which $V_{tWL}$ and $V_{tPL}$ are 0.5 V, $V_{WLH}$ and $V_{PLH}$ should be set at 3 V, and $V_{BLH}$ and $V_{SLH}$ should be set at more than or equal to 3.5 V.

The mechanism of the page erase operation of FIG. 4BA will be described continuously. At time T3-T4 as the first period, the voltage of the channel region 7 in the floating state is boosted by the first capacitive coupling between the plate line $PL_2$ and the channel region 7 and the second capacitive coupling between the word line $WL_2$ and the channel region 7 as the plate line $PL_2$ and the word line $WL_2$ are brought into the high voltage levels of the second voltage $V_{PLH}$ and the fourth voltage $V_{WLH}$. The voltage of the channel region 7 rises from $V_{FB}$"1" in the "1" write state to a high voltage. The reason why the voltage of the channel region 7 can be boosted is because the voltages of the bit lines $BL_1$ to $BL_3$ and the source line SL are as high as $V_{BLH}$ and $V_{SLH}$, so that the PN junction between the source $N^+$ layer $3a$ and the channel region 7 and the PN junction between the drain $N^+$ layer $3b$ and the channel region 7 are in a reverse-biased state.

The mechanism of the page erase operation of FIG. 4BA will be described continuously. At time T5-T6 as the next period, the voltages of the bit lines $BL_1$ to $BL_3$ and the source line SL drop from the high voltages, $V_{BLH}$ and $V_{SLH}$, to Vss. As a result, the PN junction between the source $N^+$ layer $3a$ and the channel region 7 and the PN junction between the drain $N^+$ layer $3b$ and the channel region 7 are brought into a forward-biased state as shown in FIG. 4BC, and a remaining hole group in the hole group 9 in the channel region 7 is discharged to the source $N^+$ layer $3a$ and the drain $N^+$ layer $3b$. As a result, the voltage $V_{FB}$ of the channel region 7 drops to the built-in voltage Vb of the PN junction formed by the source $N^+$ layer $3a$ and the channel region 7 which is the P layer and the PN junction formed by the drain $N^+$ layer $3b$ and the channel region 7 which is the P layer.

The mechanism of the page erase operation of FIG. 4BA will be described continuously. Next, at time T7-T8, the voltages of the bit lines $BL_1$ to $BL_3$ and the source line SL rise from Vss to the high voltages, $V_{BLH}$ and $V_{SLH}$. According to this scheme, when the plate line $PL_2$ and the word line $WL_2$ drop from the second voltage $V_{PLH}$ and the fourth voltage $V_{WLH}$ to the first voltage $V_{PLL}$ and the third voltage Vss, respectively, at time T9-T10 (the third period), the voltage $V_{FB}$ of the channel region 7 is efficiently dropped from Vb to $V_{FB}$"0" because of the first capacitive coupling between the plate line $PL_2$ and the channel region 7 and the second capacitive coupling between the word line $WL_2$ and the channel region 7 without forming the inversion layer $12a$ on the plate line $PL_2$ side and the inversion layer $12b$ on the word line $WL_2$ side in the channel region 7, as shown in FIG. 4BD. Consequently, the voltage difference $\Delta V_{FB}$ in the channel region 7 between the "1" write state and the "0" erase state is expressed by expressions below.

$$V_{FB}\text{"1"}=Vb-\beta_{WL}\times Vt_{WL}\text{"1"}-\beta_{BL}\times V_{BLH} \quad (7)$$

$$V_{FB}\text{"0"}=Vb-\beta_{WL}\times V_{WLH}-\beta_{PL}\times(V_{PLH}-V_{PLL}) \quad (8)$$

$$\Delta V_{FB}=V_{FB}\text{"1"}-V_{FB}\text{"0"}$$

$$=\beta_{WL}\times V_{WLH}+\beta_{PL}\times(V_{PLH}-V_{PLL})$$

$$-\beta_{WL}\times Vt_{WL}\text{"1"}-\beta_{BL}\times V_{BLH} \quad (9)$$

Herein, the sum of $\beta_{WL}$ and $\beta_{PL}$ is more than or equal to 0.8, and $\Delta V_{FB}$ increases, enabling a sufficient margin to be attained.

Figure 4C:
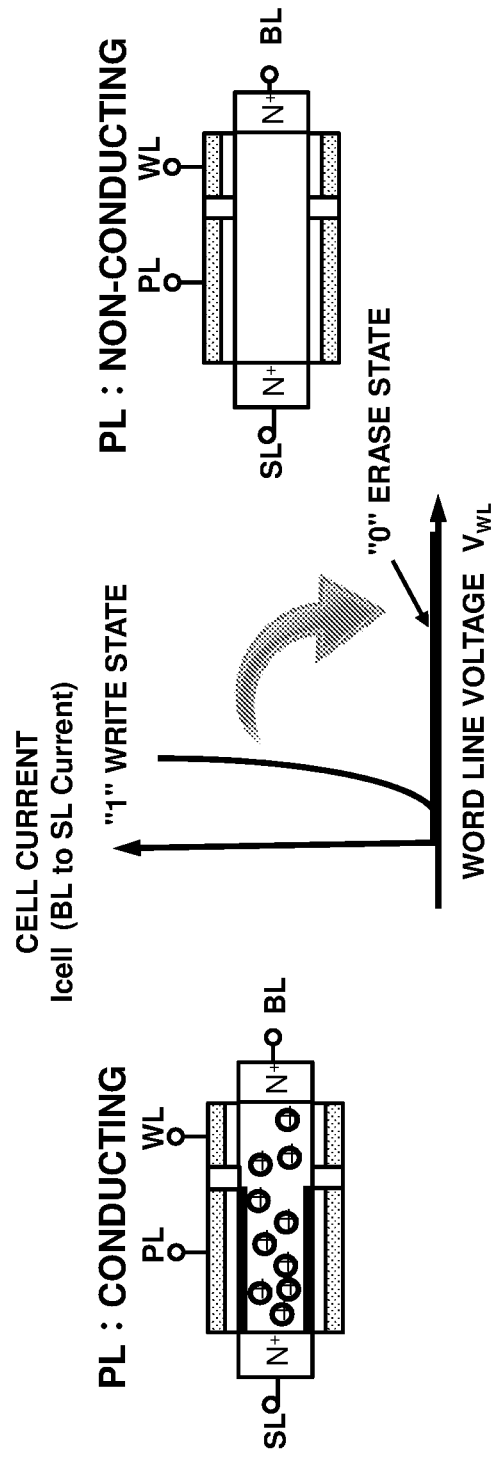
FIG. 4C shows diagrams for describing the page erase operation mechanism of the memory device having the SGT according to the first embodiment.

As a result, a wide margin is attained between the "1" write state and the "0" erase state as shown in FIG. 4C. Herein, in the "0" erase state, the threshold voltage on the plate line $PL_2$ side is high because of the substrate bias effect. Consequently, when the voltage to be applied to the plate line $PL_2$ is made less than or equal to the threshold voltage, for example, the first N-channel MOS transistor region on the plate line $PL_2$ side becomes non-conducting, thus not flowing a memory cell current. The way is shown by "PL: non-conducting" on the right side in FIG. 4C.

The page erase operation mechanism of FIG. 4BA will be described continuously. Next, at time T11-T12 as a fourth period, the voltages of the bit lines $BL_1$ to $BL_3$ and the source line SL decrease from $V_{BLH}$ to Vss and from $V_{SLH}$ to Vss, respectively, and the erase operation is terminated. On that occasion, the bit lines $BL_1$ to $BL_3$ and the source line SL slightly lower the voltage of the channel region 7 because of the capacitive couplings, which, however, is equivalent to the increase in the voltage of the channel region 7 by the bit lines $BL_1$ to $BL_3$ and the source line SL because of the capacitive couplings at time T7-T8. Thus, the increase and decrease in the voltages of the bit lines $BL_1$ to $BL_3$ and the source line SL cancel each other out, and the voltage of the channel region 7 is resultantly not affected. The page erase operation of changing the voltage $V_{FB}$"0" of this channel region 7 in the "0" erase state to a second data holding voltage (which is an example of a "second data holding voltage" as claimed) is performed for allocation to logic storage data "0". When reading data after the erase operation, a voltage to be applied to the first gate conductor layer $5a$ connecting to the plate line PL is set higher than the threshold voltage when the logic storage data is "1" and lower than the threshold voltage when the logic storage data is "0". A property in which no current flows even if the voltage of the word line WL is increased as shown in FIG. 4C is thereby obtained.

Next, the mechanism of the page erase operation will be described with reference to FIGS. 4DA to 4DD. FIGS. 4DA to 4DD are different from FIGS. 4BA to 4BD in that the bit lines $BL_1$ to $BL_3$ are set at Vss or the floating state and that the word line $WL_2$ is fixed at Vss during the page erase operation. This makes the second N-channel MOS transistor region of the word line $WL_2$ non-conducting even when the source line SL increases from Vss to $V_{SLH}$ at time T1-T2, and no memory cell current flows. This prevents the hole group 9 from being generated by the impact ionization phenomenon. As for the rest, the source line SL oscillates between Vss and $V_{SLH}$, and the plate line $PL_2$ oscillates between $V_{PLL}$ and $V_{PLH}$, similarly to FIGS. 4BA to 4BD. As a result, the hole group 9 is discharged to the $N^+$ layer $3a$ as the first impurity layer of the source line SL as shown in FIG. 4DC.

Next, the mechanism of the page erase operation will be described with reference to FIGS. 4EA to 4ED. FIGS. 4EA to 4ED are different from FIGS. 4BA to 4BD in that the source line SL is set at Vss or the floating state and that the plate line $PL_2$ is fixed at Vss during the page erase operation. This makes the first N-channel MOS transistor region of the plate line $PL_2$ non-conducting even when the bit lines $BL_1$ to $BL_3$ rise from Vss to $V_{BLH}$ at time T1-T2, and no memory cell current flows. This prevents the hole group 9 from being generated by the impact ionization phenomenon. As for the rest, the bit lines $BL_1$ to $BL_3$ oscillate between Vss and $V_{BLH}$, and the word line $WL_2$ oscillates between Vss and $V_{WLH}$, similarly to FIGS. 4BA to 4BD. As a result, the hole group 9 is discharged to the $N^+$ layer $3b$ as the second impurity layer of the bit lines $BL_1$ to $BL_3$ as shown in FIG. 4EC.

Note that conditions for the voltages to be applied to the bit line BL, the source line SL, the word line WL, and the plate line PL described above as well as the potential of the floating body are an example for performing the page erase operation, and other operating conditions that enable the page erase operation may be adopted.

FIGS. 5A to 5C are diagrams for describing a read operation of the dynamic flash memory cell according to the first embodiment of the present invention. When the channel region 7 is charged to the built-in voltage Vb (about 0.7 V) as shown in FIG. 5A, the threshold voltage of the second N-channel MOS transistor region having the second gate conductor layer 5b to which the word line WL is connected is reduced because of the substrate bias effect. This state is allocated to the logic storage data "1". As shown in FIG. 5B, a memory block selected before performing writing has been brought into the erase state "0" in advance, and the voltage $V_{FB}$ of the channel region 7 has been set at $V_{FB}$"0". By the write operation, the write state "1" is stored at random. As a result, logic storage data of the logics "0" and "1" is created for the word line WL. As shown in FIG. 5C, the sense amplifier performs reading using the difference in level between the two threshold voltages for this word line WL. When reading data, the voltage to be applied to the first gate conductor layer 5a connecting to the plate line PL is set higher than the threshold voltage when the logic storage data is "1" and lower than the threshold voltage when the logic storage data is "0". A property in which no current flows even if the voltage of the word line WL is increased as shown in FIG. 5C is thereby obtained.

Note that conditions for the voltages to be applied to the bit line BL, the source line SL, the word line WL, and the plate line PL described above as well as the potential of the floating body are an example for performing the read operation, and other operating conditions that enable the read operation may be adopted.

The page erase operation of the dynamic flash memory cell according to the first embodiment of the present invention will be described below in detail with reference to FIGS. 6A to 6F. Herein, it is characterized by connecting the plate line PL in common for adjacent pages, and when in the page erase operation, applying pulsed voltages (which is an example of "pulsed voltages" as claimed) to a word line WL which performs the page erase operation and the plate line PL, and applying a fixed voltage (which is an example of a "fixed voltage" as claimed) to a word line WL which is not selected to perform the page erase operation.

Figure 6A:
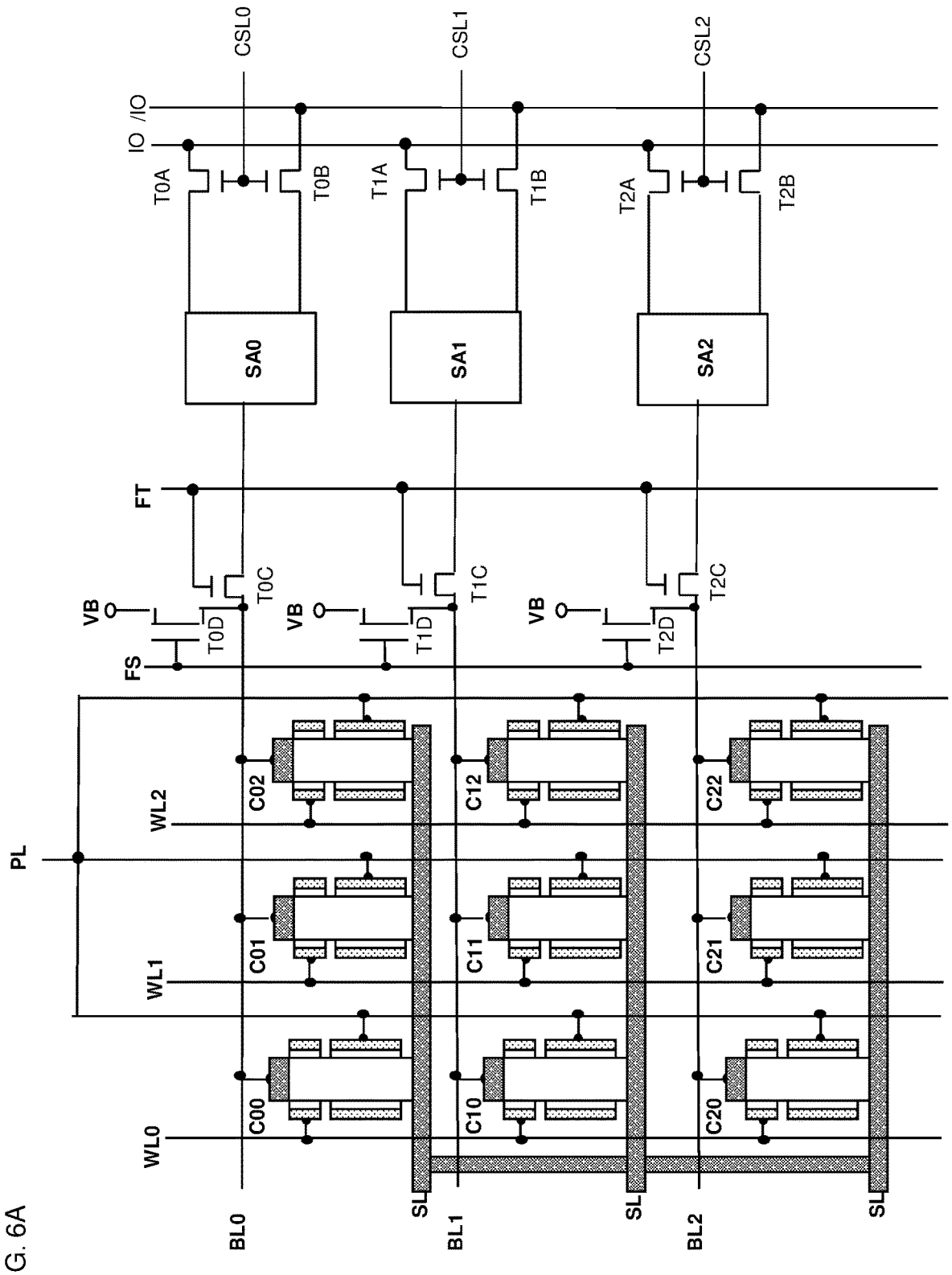
FIG. 6A is a diagram for describing providing a plate line PL of the memory device having the SGT according to the first embodiment in common for adjacent pages, and when in a page erase operation, applying pulsed voltages to a word line WL which performs a page erase operation and the plate line PL, and applying a fixed voltage to a word line which is not selected to perform the page erase operation.

In FIG. 6A, 3×3 memory cells C00 to C22 constitute part of a block. Although the 3×3 memory cells C00 to C22 are shown here, memory cells constitute a matrix larger than 3×3 in an actual block. Word lines WL0 to WL2, the plate line PL connected in common for the adjacent pages, the source line SL, and bit lines BL0 to BL2 are connected to the respective memory cells. Transistors T0C to T2C with a transfer signal FT being input to their gates constitute switching circuits. In addition, transistors T0D to T2D having their gates connected to an erase signal FS have their drains connected to a bit line erase signal VB and their sources connected to the respective bit lines BL0 to BL2. Then, the respective bit lines BL0 to BL2 are connected to sense amplifier circuits SA0 to SA2 via the switching circuits. The sense amplifier circuits SA0 to SA2 are connected to a pair of complementary input/output lines IO and /IO via transistors T0A to T2B having their gates connected to column select lines CSL0 to CSL2.

Figure 6B:
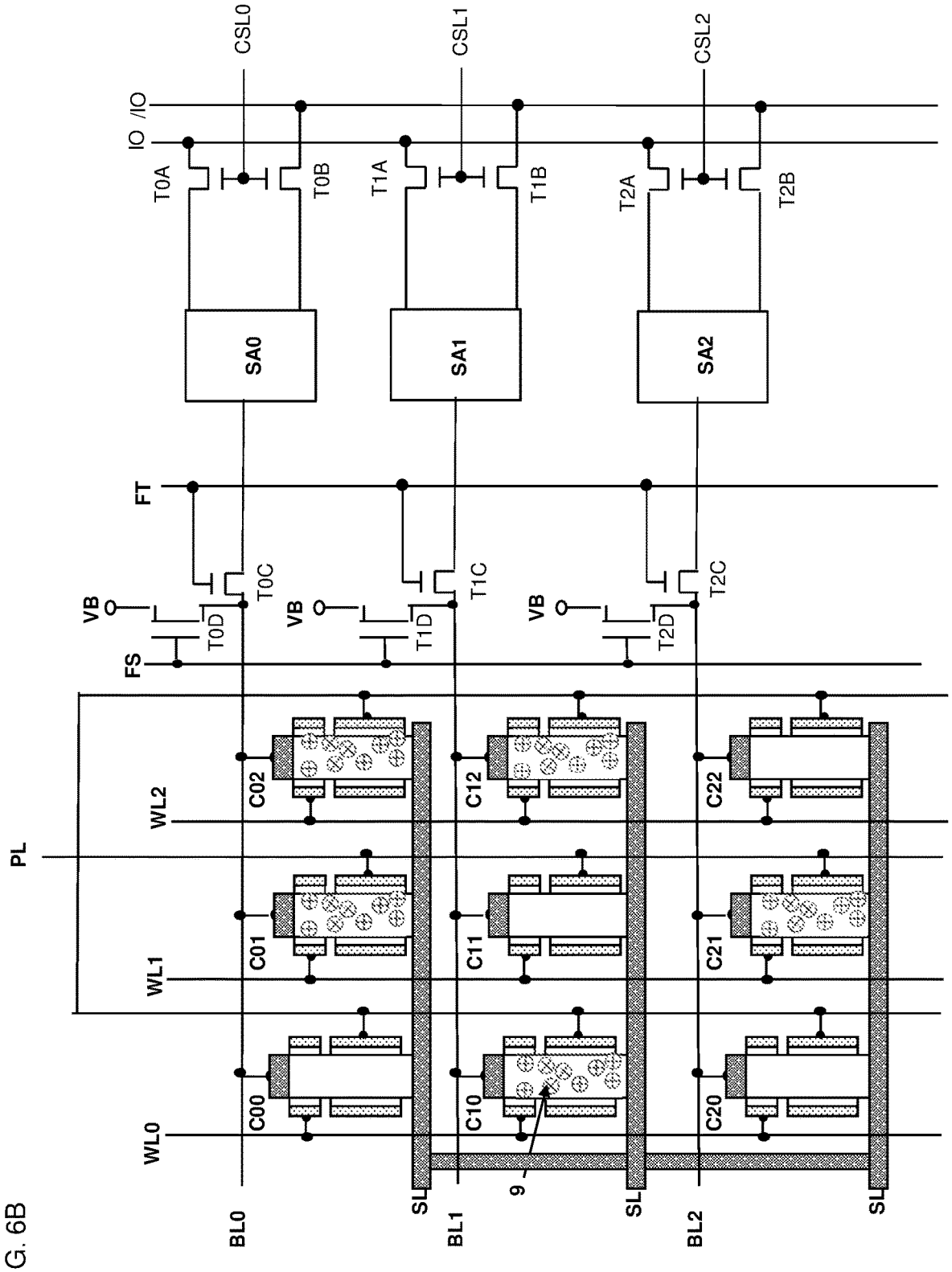
FIG. 6B is a diagram for describing providing the plate line PL of the memory device having the SGT according to the first embodiment in common for adjacent pages, and when in the page erase operation, applying pulsed voltages to the word line WL which performs the page erase operation and the plate line PL, and applying a fixed voltage to the word line which is not selected to perform the page erase operation.
Figure 6C:
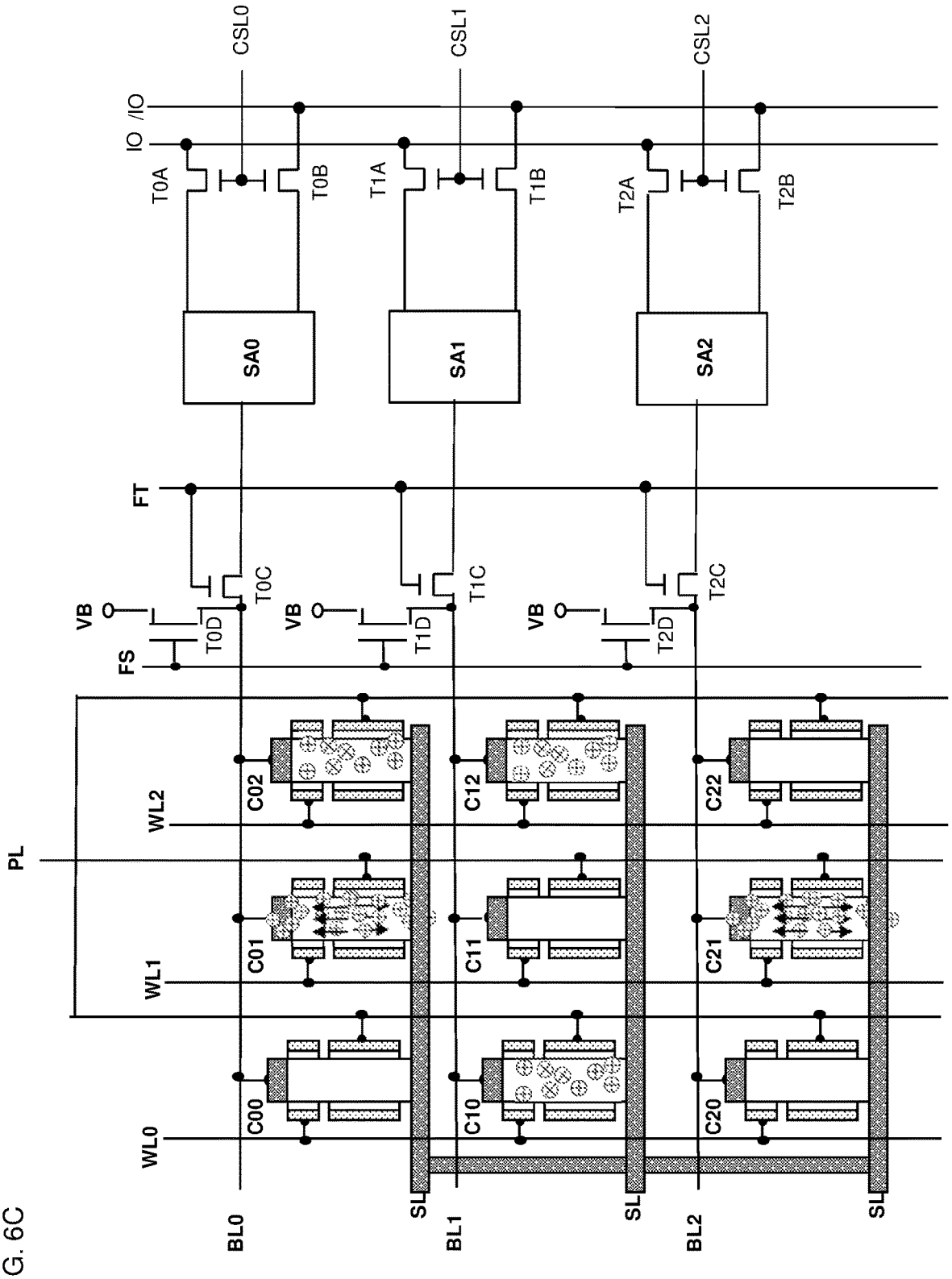
FIG. 6C is a diagram for describing providing the plate line PL of the memory device having the SGT according to the first embodiment in common for adjacent pages, and when in the page erase operation, applying pulsed voltages to the word line WL which performs the page erase operation and the plate line PL, and applying a fixed voltage to the word line which is not selected to perform the page erase operation.
Figure 6D:
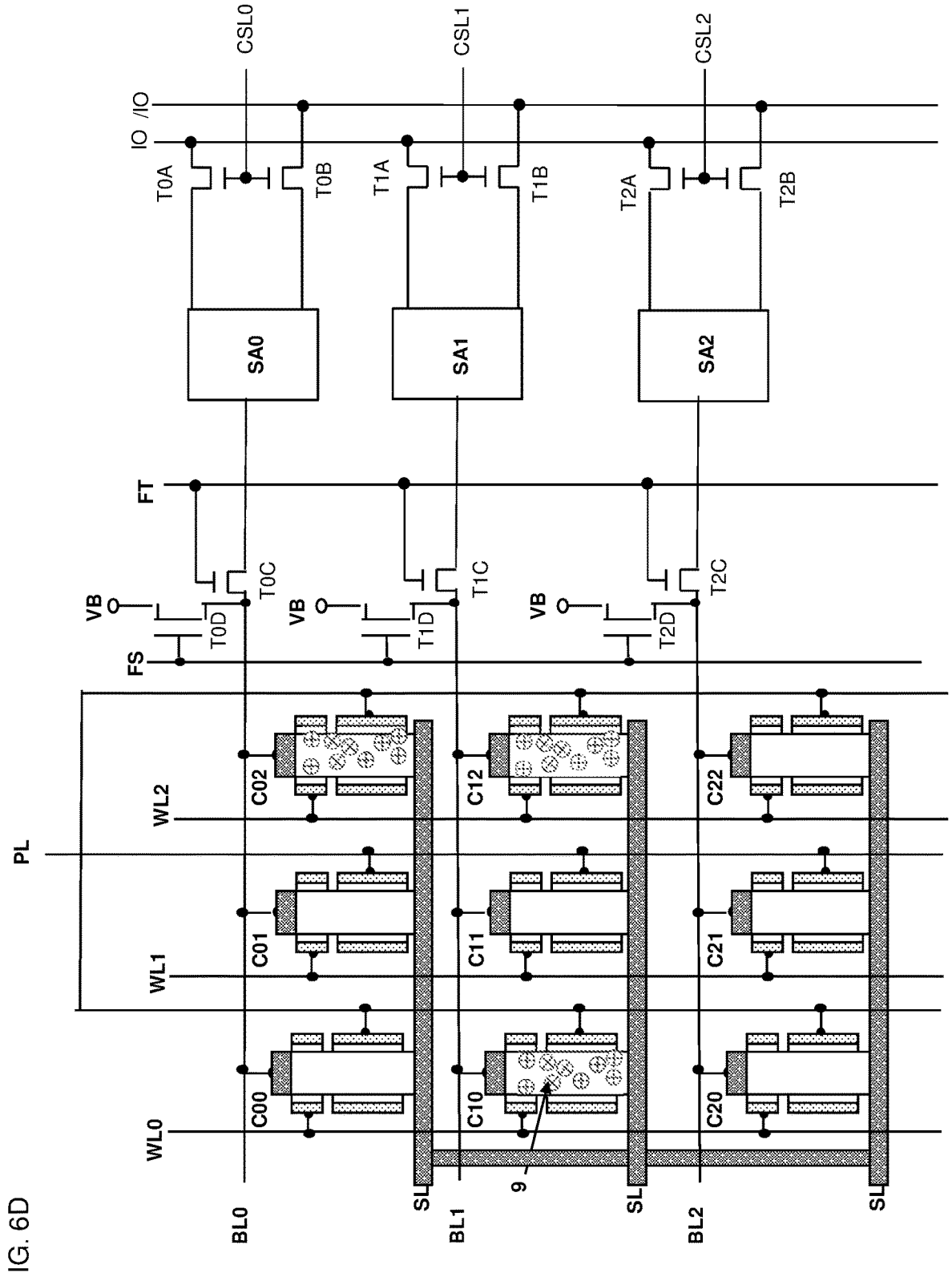
FIG. 6D is a diagram for describing providing the plate line PL of the memory device having the SGT according to the first embodiment in common for adjacent pages, and when in the page erase operation, applying pulsed voltages to the word line WL which performs the page erase operation and the plate line PL, and applying a fixed voltage to the word line which is not selected to perform the page erase operation.

FIG. 6B shows a way in which "1" is written at random into the memory cells C01, C02, C10, C12, and C21 among the memory cells C00 to C22 at any timing, and the hole group 9 is accumulated in the channel semiconductor layer 7. A case in which the memory cell group of C01, C11, and C21 connecting to the word line WL1 is selected, and the page erase operation is performed on the group of these memory cells, for example, in FIG. 6B will be described. Note that the memory cell group is defined by the memory cell group of C01, C11, and C21 selected by the word line WL1, while a plurality of such pages are arrayed in the column direction to constitute a two-dimensional block. In addition, FIG. 6C shows a way in which the hole groups 9 in the memory cells C01 and C21 storing "1" write data are extracted to the bit lines BL0, BL2 and the source line SL. FIG. 6D shows a state in which the hole groups 9 in the memory cell group of C01, C11, and C21 have been extracted.

FIG. 6E shows a time-series operation waveform diagram of FIGS. 6A to 6D. Specifically described below with reference to FIG. 6E is in the dynamic flash memory cell according to the first embodiment of the present invention, connecting the plate line PL in common for adjacent pages, and in the page erase operation, applying pulsed voltages to the word line WL which performs the page erase operation and the plate line PL, and applying a fixed voltage to the word lines WL which are not selected to perform the page erase operation.

At time E1-E15 in FIG. 6E, the page erase operation is performed. At time E1, the page erase operation is started. At time E2, the transfer signal FT decreases from a high voltage $V_{FTH}$ to the low voltage Vss, and the sense amplifier circuits SA0 to SA2 are disconnected from the corresponding bit lines BL0 to BL2.

At time E3 in FIG. 6E, the erase signal FS rises from the low voltage Vss to a high voltage $V_{FSH}$ to prepare for applying the bit line erase signal VB to the bit lines BL0 to BL2 from the drains of the transistors T0D to T2D. Then, at time E3-E14, the bit lines BL0 to BL2 oscillate between Vss and $V_{BLE}$ during the page erase operation. An equal pulsed voltage is applied to the source line SL in synchronization with the bit lines BL0 to BL2. Consequently, even if the bit lines BL0 to BL2 and the source line SL oscillate between Vss and $V_{BLE}$ and between Vss and $V_{SLE}$, respectively, during the page erase operation, no memory cell current flows to the memory cells C01, C11, and C21 of the memory cell group selected by the word line WL1, which prevents the hole group 9 from being generated by impact ionization. Herein, the high voltage $V_{BLE}$ of the bit lines BL0 to BL2 when in the page erase operation and the high voltage $V_{SLE}$ of the source line SL when in the page erase operation are an equal voltage. In addition, the source line SL is provided in common for a plurality of pages, and is connected to a decoder circuit and a pulse generation circuit (neither shown) such that an equal pulsed voltage can be applied to the source line SL in synchronization with the bit line BL when in the page erase operation.

Then, at E5-E12 in FIG. 6E, pulsed voltages are applied to the word line WL1 which performs the page erase operation and the plate line PL provided in common for adjacent pages. The word line WL1 which performs the page erase operation is raised from the low voltage Vss to a high voltage $V_{WLE}$, and again dropped to the low voltage Vss. In addition, the plate line PL is raised from the low voltage Vss to a high voltage $V_{PLE}$, and again dropped to the low voltage Vss. At E5-E12 in FIG. 6E, a fixed voltage $V_{WLL}$ is applied to the word lines WL0 and WL2 which are not selected to perform the page erase operation. Herein, the fixed voltage $V_{WLL}$ may be a ground voltage (which is an example of a "ground voltage" as claimed) Vss, for example.

At time E3-E14 in FIG. 6E, the page erase operation is performed in the word line WL1, and the hole groups 9 in the memory cells C01 and C21 storing "1" write data are extracted to the bit lines BL0 and BL2 and the source line SL as shown in FIG. 6C. Then, as shown in FIG. 6D, the state in which the hole groups 9 in the memory cell group of C01, C11, and C21 have been extracted is brought about. Herein, the word lines WL0 and $WL_2$ which are not selected to perform the page erase operation are maintained at the fixed voltage $V_{WLL}$ which is the low voltage at E5-E12 in FIG. 6E. As a result, the hole groups 9 in the memory cell C10, the memory cell C02, and the memory cell C12 storing "1" write data will not be extracted to the bit lines BL0 to BL2 and the source line SL.

Note that the page erase operation for extracting the hole group 9 through another bit line is similar to the description with reference to FIG. 4BA.

When the page erase operation is terminated at time E14 shown in FIG. 6E, the transfer signal FT rises from Vss to $V_{FTH}$ at time E15, so that the transistors T0C to T2C become conducting. As a result, the sense amplifier circuits SA0 to SA2 corresponding to the bit lines BL0 to BL2 are connected.

In addition, the circuit block shown in FIGS. 6A to 6D is capable of outputting page data in the first memory cell group of C01, C11, and C21 read to the sense amplifier circuits SA0 to SA2 to the complementary input/output lines IO and/IO when in the page erase operation of the memory device having the dynamic flash memory cell according to the first embodiment of the present invention.

Figure 6F:
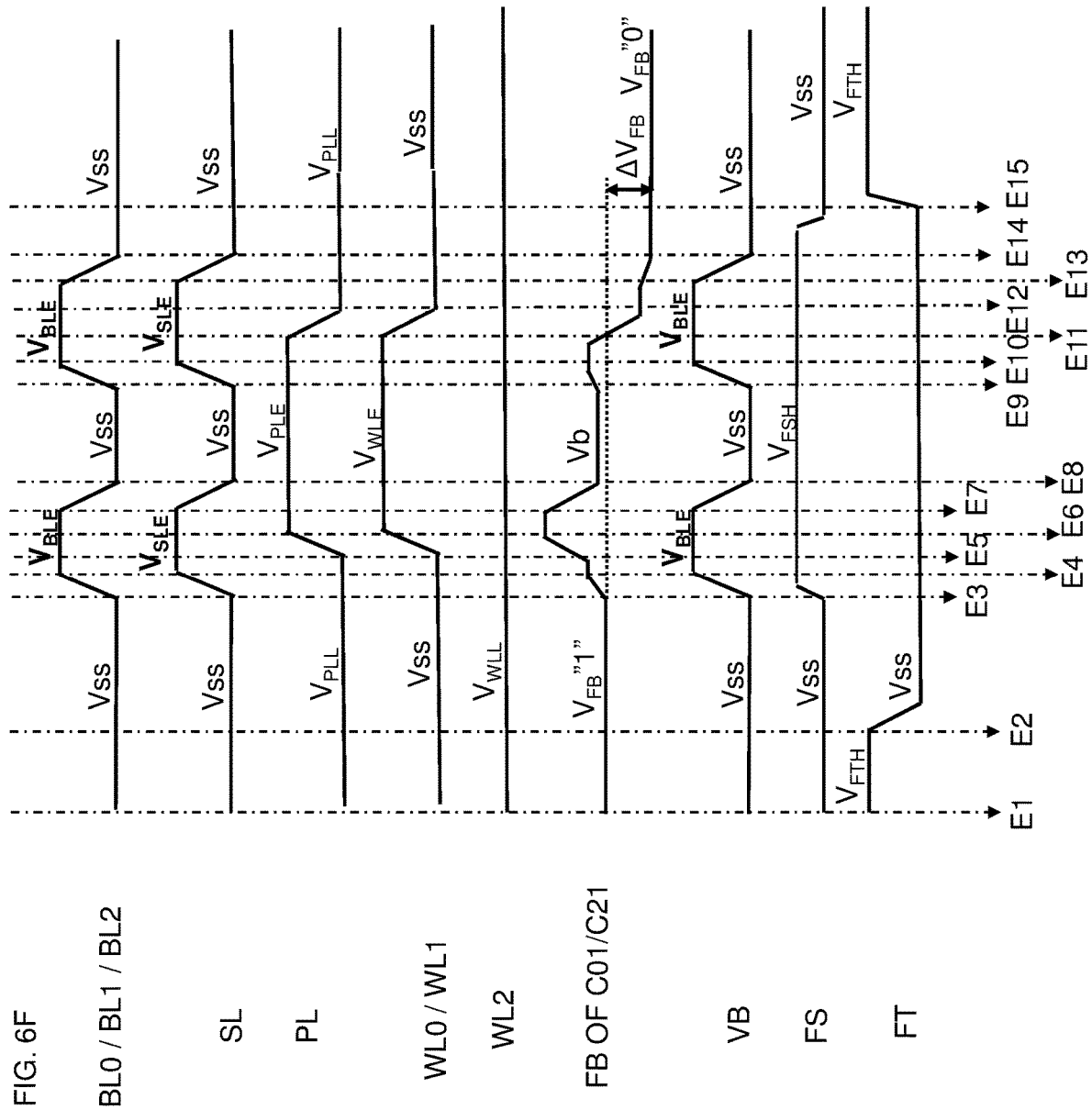
FIG. 6F is a diagram for describing providing the plate line PL of the memory device having the SGT according to the first embodiment in common for adjacent pages, and when in the page erase operation, applying pulsed voltages to the word line WL which performs the page erase operation and the plate line PL, and applying a fixed voltage to the word line which is not selected to perform the page erase operation.
Figure 7B:
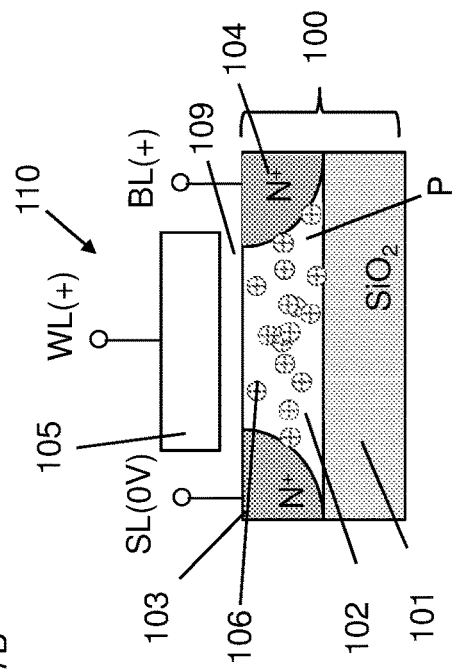
FIGS. 7A, 7B, 7C and 7D show diagrams for describing a write operation of a capacitor-less DRAM memory cell according to a conventional example.
Figure 7A:
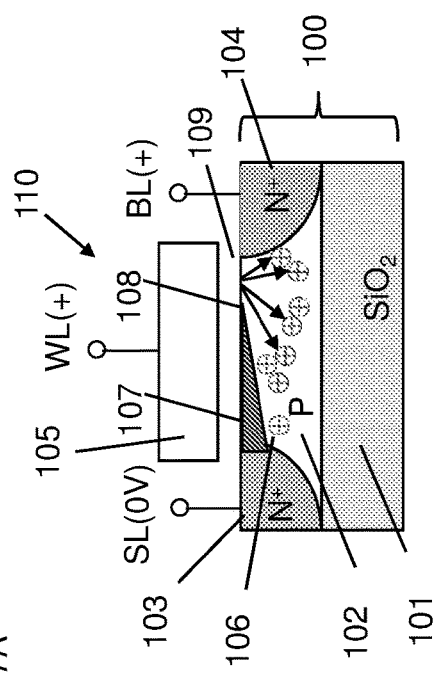
Figure 7D:
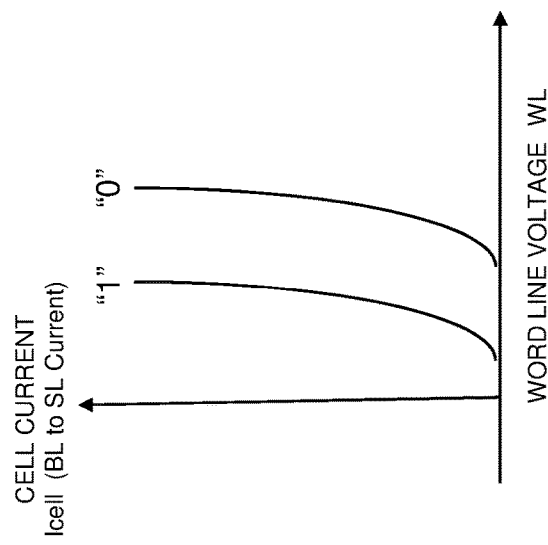
Figure 7C:
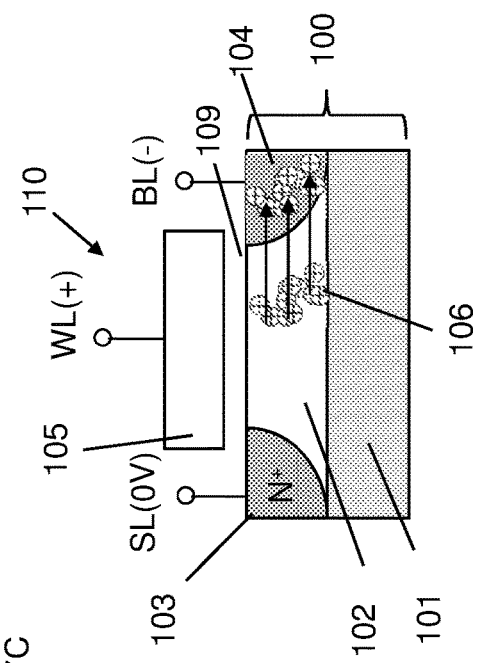
Figure 8A:
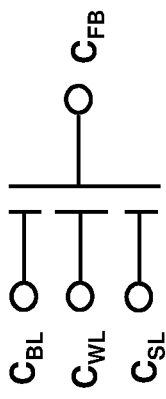
FIGS. 8A and 8B shows diagrams for describing operational problems of the capacitor-less DRAM memory cell according to the conventional example.
Figure 8B:
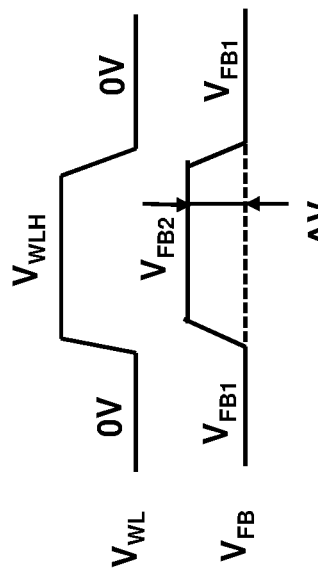

FIG. 6F shows a case in which the word lines WL0 and WL1 are selected at the same time, and the page erase operation is performed. The word lines WL can easily be selected at the same time by providing an address latch circuit for a low decoder circuit for selecting the word lines WL (not shown).

In FIG. 1, the Si pillar 2 enables the dynamic flash memory operation described in the present embodiment to be performed even if its horizontal cross-sectional shape is circular, elliptic, or rectangular. In addition, circular, elliptic, or rectangular dynamic flash memory cells may be present in a mixed manner on the same chip.

In addition, the dynamic flash memory device has been described with reference to FIG. 1 using, as an example, the SGT provided with the first gate insulating layer 4a and the second gate insulating layer 4b that surround the whole of the side surface of the Si pillar 2 standing in the vertical direction on the substrate, and having the first gate conductor layer 5a and the second gate conductor layer 5b that surround the first gate insulating layer 4a and the second gate insulating layer 4b as a whole. As stated in the description of the present embodiment, the present dynamic flash memory device should have a structure that satisfies the condition that the hole group 9 generated by the impact ionization phenomenon is held in the channel region 7. For this purpose, the channel region 7 should have a floating body structure isolated from a substrate 1. This enables the aforementioned dynamic flash memory operation to be performed using the Gate All Around (GAA: see Non Patent Literature 11, for example) technology, which is one of the SGT, for example, and the Nanosheet technology (see Non Patent Literature 12, for example) even if a semiconductor base of the channel region is formed horizontally with respect to the substrate 1. Alternatively, a device structure (see Non Patent Literatures 7 to 10, for example) through use of a silicon on insulator (SOI) may be adopted. In this device structure, the bottom of a channel region is in contact with an insulating layer of an SOI substrate, and surrounds another channel region, and is surrounded by a gate insulating layer and a device isolation insulating layer. In this structure, the channel region also has the floating body structure. In this manner, the dynamic flash memory device provided by the present embodiment should satisfy the condition that the channel region has the floating body structure. Alternatively, a structure in which a Fin transistor (see Non Patent Literature 13, for example) is formed on a SOI substrate also enables the present dynamic flash operation to be performed as long as the channel region has the floating body structure.

Alternatively, in "1" writing, electron-hole pairs may be generated using a gate induced drain leakage (GIDL) current (see Non Patent Literature 14, for example), and the channel region 7 may be filled with the generated hole group.

In addition, Expressions (1) to (12) in the present description and drawings are expressions used for qualitatively describing the phenomenon, and the phenomenon is not limited by those expressions.

Note that although the reset voltage of the word line WL, the bit line BL, and the source line SL is described as Vss in the description of FIGS. 3AA to 3AC and 3B, voltages different from each other may be used.

In addition, an example of page erase operation conditions is shown in FIG. 4A and description thereof. On the other hand, the voltages to be applied to the source line SL, the plate line PL, the bit line BL, and the word line WL may be changed as long as a state in which the hole group 9 present in the channel region 7 is removed from either or both of the N+ layer 3a and the N+ layer 3b can be achieved. Alternatively, in the page erase operation, a voltage may be applied to the source line SL of a selected page, and the bit line BL may be brought into the floating state. Alternatively, in the page erase operation, a voltage may be applied to the bit line BL of a selected page, and the source line SL may be brought into the floating state.

In addition, in FIG. 1, potential distributions of the first channel region 7a and the second channel region 7b are formed continuously in the channel region 7 at a portion surrounded by the insulating layer 6 which is the first insulating layer in the vertical direction. This makes the channel region 7 including the first channel region 7a and the second channel region 7b continuous in the vertical direction in the region surrounded by the insulating layer 6 which is the first insulating layer.

Note that in FIG. 1, it is desirable to make the vertical length of the first gate conductor layer 5a to which the plate line PL is connected even longer than the vertical length of the second gate conductor layer 5b to which the word line WL is connected to satisfy $C_{PL}>C_{WL}$. However, merely by adding the plate line PL, the coupling ratio of the capacitive coupling of the word line WL to the channel region 7 ($C_{WL}/(C_{PL}+C_{WL}+C_{BL}+C_{SL})$) decreases. As a result, the potential variation $\Delta V_{FB}$ of the channel region 7 as the floating body decreases.

In addition, a fixed voltage of approximately 1 V may be applied, for example, as the voltage $V_{PLL}$ of the plate line PL.

Note that the meaning of "covers" in a case in which the present description and claims state that "a gate insulating layer, a gate conductor layer, or the like covers a channel and the like" includes a case of surrounding the whole as in the SGT and GAA, a case of surrounding the whole except a portion as in a Fin transistor, and even such a case of overlapping a planar object as in a planar transistor.

In FIG. 1, the first gate conductor layer 5a surrounds the whole of the first gate insulating layer 4a. On the other hand, the first gate conductor layer 5a may be structured to surround part of the first gate insulating layer 4a in plan view. This first gate conductor layer 5a may be divided into at least two gate conductor layers to be operated as electrodes of the plate line PL. Similarly, the second gate conductor layer 5b may be divided into two or more to be operated synchronously or asynchronously, each serving as a conductor electrode of the word line. The dynamic flash memory operation can thereby be performed.

The page erase operation of the 1-bit dynamic flash memory cell composed of a single semiconductor base has been described with reference to FIGS. 6A to 6F, whilst the present invention is also effective for each operation mode of a 1-bit high-speed dynamic flash memory cell composed of two semiconductor bases that store "1" and "0" complementary data.

In addition, in FIG. 1, the first gate conductor layer 5a may be divided into two or more to be operated synchronously or asynchronously, each serving as a conductor electrode of the plate line, at the same driving voltage or different driving voltages. Similarly, the second gate conductor layer 5b may be divided into two or more to be operated synchronously or asynchronously, each serving as a conductor electrode of the word line, at the same driving voltage or different driving voltages. This also enables the dynamic flash memory operation to be performed. Then, in the case of dividing the first gate conductor layer 5a into two or more, at least one division of the first gate conductor layer serves as the above-described first gate conductor layer 5a. In addition, in the divided second gate conductor layer 5b, at least one division of the second gate conductor layer also serves as the above-described second gate conductor layer 5b.

Alternatively, in FIG. 1, the first gate conductor layer 5a may be connected to the word line WL, and the second gate conductor layer 5b may be connected to the plate line PL. This also enables the present dynamic flash memory operation described above to be performed.

In addition, the conditions for the voltages to be applied to the bit line BL, the source line SL, the word line WL, and the plate line PL as well as the potential of the floating body described above are an example for performing basic operations of the erase operation, the write operation, and the read operation. Any other voltage conditions that enable the basic operations of the present invention to be performed may be adopted.

The present embodiment provides the following features.
(Feature 1)

In the dynamic flash memory cell of the present embodiment, the $N^+$ layers 3a and 3b to serve as the source and the drain, the channel region 7, the first gate insulating layer 4a, the second gate insulating layer 4b, the first gate conductor layer 5a, and the second gate conductor layer 5b are formed into a pillar shape as a whole. In addition, the $N^+$ layer 3a to serve as the source is connected to the source line SL, the $N^+$ layer 3b to serve as the drain is connected to the bit line BL, the first gate conductor layer 5a is connected to the plate line PL, and the second gate conductor layer 5b is connected to the word line WL, respectively. The present dynamic flash memory cell is characteristic for such a structure that the gate capacitance of the first gate conductor layer 5a to which the plate line PL is connected is larger than the gate capacitance of the second gate conductor layer 5b to which the word line WL is connected. In the present dynamic flash memory cell, the first gate conductor layer and the second gate conductor layer are stacked in the vertical direction. Thus, the memory cell area is not increased in plan view even with the structure in which the gate capacitance of the first gate conductor layer 5a to which the plate line PL is connected is larger than the gate capacitance of the second gate conductor layer 5b to which the word line WL is connected. This enables higher performance and higher integration of the dynamic flash memory cell to be achieved at the same time.

(Feature 2)

The plate line PL of the dynamic flash memory cell according to the first embodiment of the present invention is provided in common for adjacent pages, and when in the page erase operation, pulsed voltages are applied to the word line WL which performs the page erase operation and the plate line PL, and a fixed voltage is applied to word lines which are not selected to perform the page erase operation. As a result, the page erase operation can easily be performed by selecting the word line WL even if the plate line PL is used in common. Providing the plate line PL in common for adjacent pages advantageously eliminates the need to separate the plate line PL for each page, and significantly facilitates the manufacturing process. In addition, by providing the plate line PL in common, an effect of shielding against electric noise is exerted, and the write data holding property of the memory cells is significantly improved, which enables a highly reliable memory device to be provided.

(Feature 3)

Paying attention to the role of the first gate conductor layer 5a of the dynamic flash memory cell according to the first embodiment of the present invention to which the plate line PL is connected, the voltage of the word line WL oscillates up and down when the dynamic flash memory cell performs the write and read operations. On this occasion, the plate line PL serves to reduce the capacitive coupling ratio between the word line WL and the channel region 7. As a result, an influence to be exerted upon voltage changes in the channel region 7 when the voltage of the word line WL oscillates up and down can be significantly reduced. The threshold voltage difference in the transistor region of the word line WL indicating the logics "0" and "1" can thereby be increased. This leads to a wider operation margin of the dynamic flash memory cell.

In addition, in "1" writing, electron-hole pairs may be generated by the impact ionization phenomenon through use of a gate induced drain leakage (GIDL) current described in Non Patent Literature 10 and Non Patent Literature 14, and the floating body FB may be filled with the generated hole group. The same applies to other embodiments according to the present invention.

In addition, in FIG. 1, the dynamic flash memory operation is also performed in a structure obtained by reversing the polarities of the conductivity types of the $N^+$ layers 3a, 3b and the P-layer Si pillar 2. In this case, the majority carriers are electrons in the Si pillar 2 which is the N-type. Therefore, the electron group generated by impact ionization is stored in the channel region 7, and the "1" state is set.

Other Embodiments

Note that although a Si pillar is formed in the first embodiment, a semiconductor pillar made of a semiconductor material other than Si may be formed. The same applies to other embodiments according to the present invention.

In addition, various embodiments and modifications of the present invention may be made without departing from the broad spirit and scope of the present invention. In addition, each of the embodiments described above is for describing an embodiment of the present invention, and does not limit the scope of the present invention. The above-described embodiments and modifications can be combined with each other in any way. Furthermore, embodiments from which some of constituent features of the embodiments are removed according to necessity also fall within the technical idea of the present invention.

INDUSTRIAL APPLICABILITY

The memory device through use of a semiconductor device according to the present invention enables a dynamic flash memory which is a memory device through use of a high-density and high-performance SGT to be obtained.

The invention claimed is:

1. A memory device through use of a semiconductor device, including a plurality of pages arrayed in a column direction, each of the pages being composed of a plurality of memory cells arrayed on a substrate in a row direction, wherein
  each of the memory cells included in each of the pages has,
    a semiconductor base standing in a vertical direction or extending in a horizontal direction on the substrate with respect to the substrate,
    a first impurity layer and a second impurity layer located on opposite ends of the semiconductor base,
  a first gate insulating layer that surrounds part or whole of a side surface of the semiconductor base between the first impurity layer and the second impurity layer, and is in contact with or proximate to the first impurity layer,
    a second gate insulating layer that surrounds the side surface of the semiconductor base, connects to the first gate insulating layer, and is in contact with or proximate to the second impurity layer,
    a first gate conductor layer that covers part or whole of the first gate insulating layer,
    a second gate conductor layer that covers the second gate insulating layer, and
    a channel semiconductor layer in which the semiconductor base is covered by the first gate insulating layer and the second gate insulating layer,
  the memory device controls voltages to be applied to the first gate conductor layer, the second gate conductor layer, the first impurity layer, and the second impurity layer to perform a page write operation and a page erase operation,
  the first impurity layer of the each of the memory cells is connected to a source line, the second impurity layer is connected to a bit line, one of the first gate conductor layer and the second gate conductor layer is connected to one of word lines, and the other is connected to a first driving control line, and
  the first driving control line is provided in common for adjacent ones of the pages, and when in the page erase operation, the memory device applies pulsed voltages to one of the word lines which performs the page erase operation and the first driving control line, and applies a fixed voltage to another one of the word lines which is not selected to perform the page erase operation.

2. The memory device through use of a semiconductor device according to claim 1, wherein the fixed voltage is a ground voltage.

3. The memory device through use of a semiconductor device according to claim 1, wherein the one of the word lines which performs the page erase operation includes at least one or more selected word lines.

4. The memory device through use of a semiconductor device according to claim 1, wherein a first gate capacitance between the first gate conductor layer and the channel semiconductor layer is larger than a second gate capacitance between the second gate conductor layer and the channel semiconductor layer.

5. The memory device through use of a semiconductor device according to claim 1, wherein when seen in a central axis direction, the first gate conductor layer surrounds the first gate insulating layer, and is separated into at least two conductor layers.

6. The memory device through use of a semiconductor device according to claim 1, wherein
  when in the page write operation, the memory device holds a hole group generated by an impact ionization phenomenon in the channel semiconductor layer to change a voltage of the channel semiconductor layer to a first data holding voltage which is higher than a voltage of one of or voltages of both of the first impurity layer and the second impurity layer, and
  when in the page erase operation, the memory device controls voltages to be applied to the first impurity layer, the second impurity layer, the first gate conductor layer, and the second gate conductor layer to extract the hole group from one or both of the first impurity layer and the second impurity layer, and change the voltage of the channel semiconductor layer to a second data holding voltage which is lower than the first data holding voltage.

\* \* \* \* \*